(12) United States Patent
Abelson et al.

(10) Patent No.: US 7,592,254 B2
(45) Date of Patent: Sep. 22, 2009

(54) METHODS FOR COATING AND FILLING HIGH ASPECT RATIO RECESSED FEATURES

(75) Inventors: John R. Abelson, Urbana, IL (US); Sreenivas Jayaraman, Sunnyvale, CA (US); Gregory S. Girolami, Urbana, IL (US); Yu Yang, Urbana, IL (US); Do Young Kim, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 213 days.

(21) Appl. No.: 11/554,748

(22) Filed: Oct. 31, 2006

(65) Prior Publication Data
US 2007/0141779 A1 Jun. 21, 2007

Related U.S. Application Data

(60) Provisional application No. 60/732,007, filed on Nov. 1, 2005.

(51) Int. Cl.
*H01L 21/44* (2006.01)
(52) U.S. Cl. .................. 438/677; 438/783; 438/758; 427/249.2; 427/255.23; 257/E21.478; 257/E21.586
(58) Field of Classification Search ............... 438/677, 438/758, 783; 427/249.2, 571, 255.23, 255.28; 257/E21.478, E21.586
See application file for complete search history.

(56) References Cited

U.S. PATENT DOCUMENTS

| | | | | |
|---|---|---|---|---|
| 5,789,317 A | * | 8/1998 | Batra et al. | 438/642 |
| 5,827,408 A | * | 10/1998 | Raaijmakers | 204/192.12 |
| 6,444,263 B1 | * | 9/2002 | Paranjpe et al. | 427/250 |
| 6,537,905 B1 | | 3/2003 | Chen et al. | |
| 6,787,483 B1 | | 9/2004 | Bayman et al. | |
| 6,846,745 B1 | | 1/2005 | Papasouliotis et al. | |
| 6,903,031 B2 | | 6/2005 | Karim et al. | |
| 2004/0082167 A1 | * | 4/2004 | Seo et al. | 438/658 |

OTHER PUBLICATIONS

Cote et al. (1999) "Plasma-Assisted Chemical Vapor Deposition of Dielectric Thin Films for ULSI Semiconductor Circuits," *IBM J. Res. Dev.* 43:5-38.

Crowell, J.E. (Sep. 2003) "Chemical Methods of Thin Film Deposition: Chemical Vapor Deposition, Atomic Layer Deposition, and Related Technologies," *J. Vac. Sci. Technol. A* 21(5):S88-S95.

(Continued)

*Primary Examiner*—Caridad M Everhart
(74) *Attorney, Agent, or Firm*—Greenlee, Winner and Sullivan, P.C.

(57) ABSTRACT

The present invention provides methods for conformally or superconformally coating and/or uniformly filling structures with a continuous, conformal layer or superconformal layer. Methods of the present invention improve conformal or superconformal coverage of surfaces and improve fill in recessed features compared to conventional physical deposition and chemical deposition methods, thereby minimizing formation of voids or gaps in a deposited conformal or superconformal layer. The present methods are capable of coating or filling features useful for the fabrication of a broad class of electronic, electrical and electromechanical devices.

42 Claims, 11 Drawing Sheets

OTHER PUBLICATIONS

Fehsenfeld et al. (Mar. 1965) "Microwave Discharge Cavities Operating at 2450 MHz," *Rev. Sci Instrum.* 36(3):294-298.

Gordon et al. (2003) "A Kinetic Model for Step Coverage by Atomic Layer Deposition in Narrow Holes or Trenches," *Chem. Vapor Depos.* 9(2):73-78.

Han et al. (2005) "Advances AI Damascene Process for Fine Trench Under 70nm Design Rule," *Mater. Res. Soc. Symp. Proc.* 863:B8.23.1-B8.23.6.

Heitzinger et al. (2003) "Simulation of Arsenic In Situ Doping With Polysilicon CVD and Its Applications to High Aspect Ratio Trenches," *IEEE Tran. Aided Design.* 22(3):285-292.

Islamraja et al. (1991) "A 3-Dimensional Model for Low-Pressure Chemical-Vapor-Deposition Step Coverage in Trenches and Circular Vias," *J. Appl. Phys.* 70:7137.

Jayaraman et al. (2005) "Chromium Diboride Thin Films by Low Temperature Chemical Vapor Deposition," *J. Vac. Sci Technol.* 23:631.

Kim, H. (Nov. 2003) "Atomic Layer Deposition of Metal and Nitride Thin Films: Current Research Efforts and Applications for Semiconductor Device Processing," *J. Vac. Sci Technol. B* 21(6):2231-2261.

Kuech et al. (1991) "Selective Epitaxy of GaAs, $Al_xGa_{1-x}As$, and $In_xGa_{1-x}As$," *J. Cryst. Growth* 107:116-128.

Lim et al. (2003) "Atomic Layer Deposition of Transition Metals," *Nat. Mater.* 2:749-754.

McCarrol (Feb. 1969) "An Improved Microwave Discharge Cavity for 2450MHz," *Rev. Sci. Instrum.* 41(2):279-280.

Nguyen, S.V. (1999) "High-Density Plasma Chemical Vapor Deposition of Silicon-Based Dielectric Films for Integrated Circuits," *IBM J. Res. Dev.* 43:109.

Nuruddin et al. (1994) "Surface Reaction Probability in Hydrogenated Amorphous Silicon Growth," *J. Appl. Phys.* 76:3123.

Rossnagel, S.M. (Sep. 1998) "Directional and Ionized Physical Vapor Deposition for Microelectronics Applications," *J. Vac. Sci. Technol. B.* 16(5):2585-2608.

Rossnagel, S.M. (Jan./Mar. 1999) "Sputter Deposition for Semiconducting Manufacturing," *IBM J. Res. Dev.* 43(1/2):163-179.

Saraswat et al. (1984) "Selective CVD of Tungsten for VSLI Technology," *J. Electrochem. Soc.* 131:C86 (abstract).

Schwarz-Selinger et al. (Jan. 2001) "Quantification of a Radical Beam Source for Methyl Radicals," *J. Vac. Sci. Technol. A* 19(1):101-107.

Shim et al. (2002) "Bottom-up Filling Submicrometer Features in Catalyst-Enhanced Chemical Vapor Deposition of Copper," *J. Electrochem Soc.* 149(2):G109-G113.

Takenaka et al. (Jul. 2004) "Anisotropic Deposition of Cu in Trenches by H-Assisted Plasma Chemical Vapor Deposition," *J. Vac. Sci. Technol. A* 22(4):1903-1907.

Tschersich et al. (1998) "Formation of an Atomic Hydrogen Beam by a Hot Capillary," *J. Appl. Phys.* 84:4065.

Vereecken et al. (2005) "The Chemistry of Additives in Damascene Copper Plating," *IBM J. Res. Dev.* 49:3-18.

Wulu et al. (1991) "Simulation of Mass Transport for Deposition in Via Holes and Trenches," *J. Electrochem. Soc.* 138(6):1831-1840.

Gordon, R.G. (2004) "Review of Recent Progress in Atomic Layer Deposition (ALD) of Materials for Micro- and Nano-Electronics," *Abstr. Pap. Am. Chem. Soc.* 227:U553.

*International Technology Roadmap for Semiconductors 2004 Update*, Semiconductor Ind. Assoc., Santa Clara, CA (2004).

\* cited by examiner

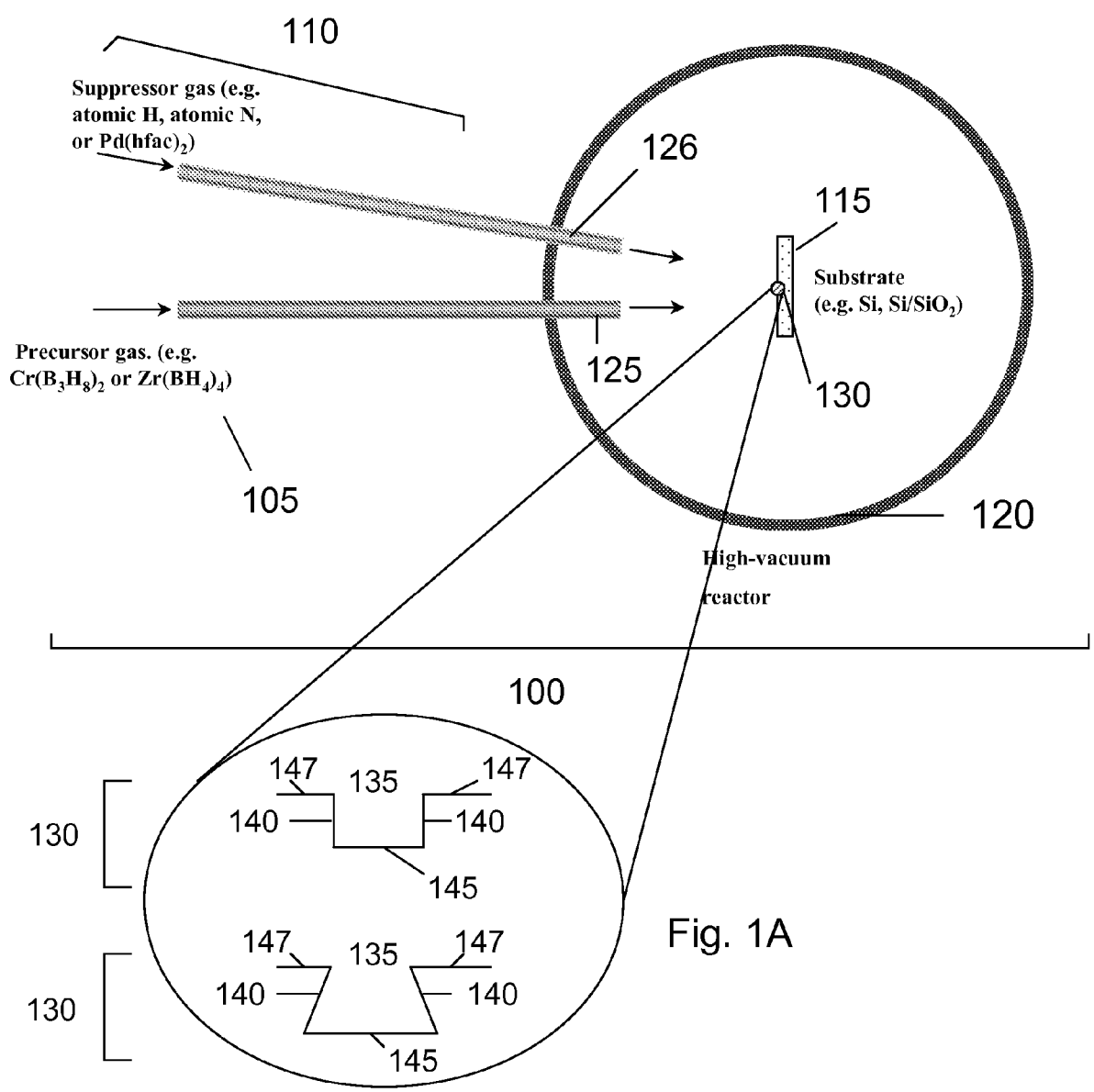

CVD Growth on Trench Structures with the Suppressor

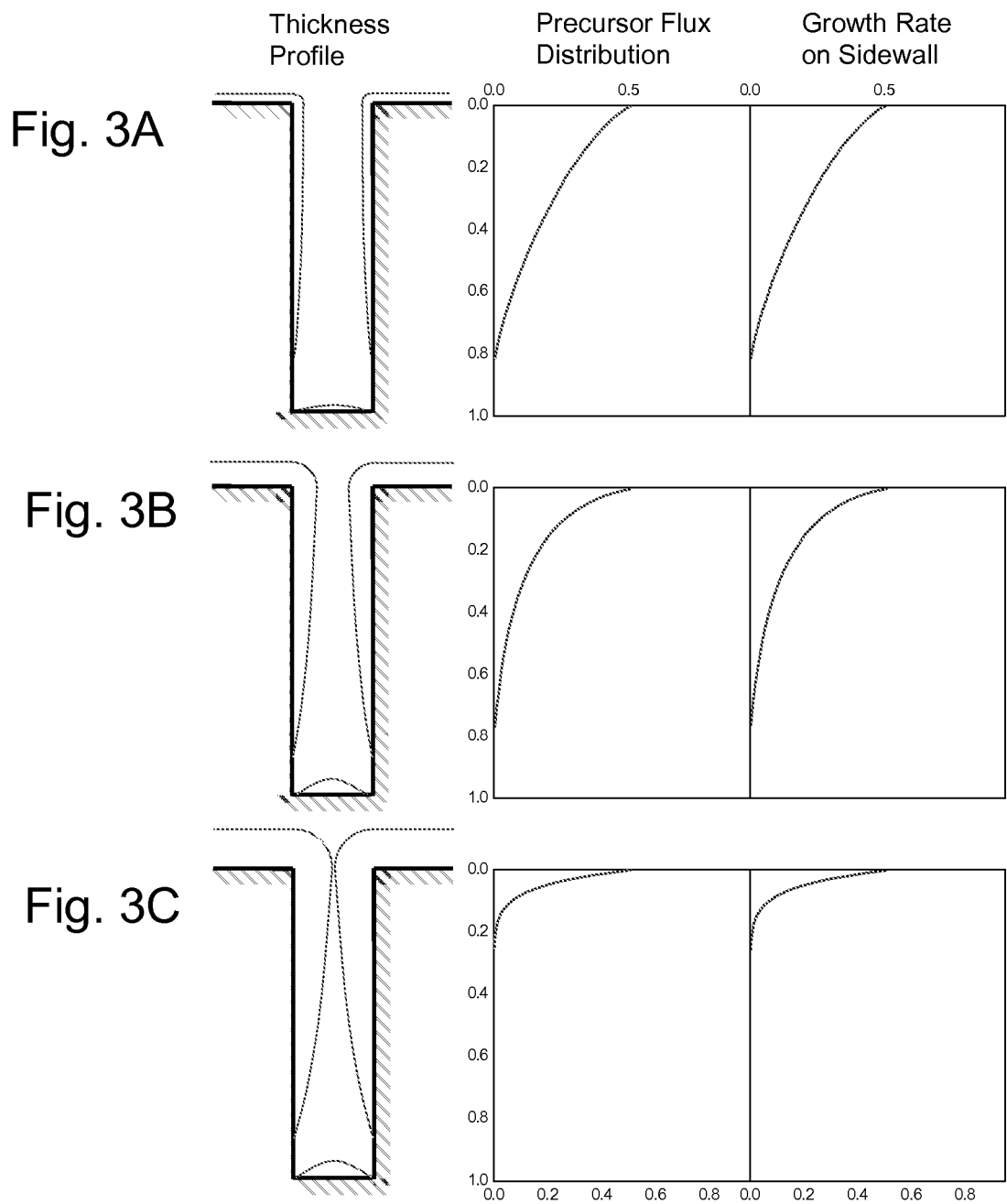

METHODS FOR COATING AND FILLING HIGH ASPECT RATIO RECESSED FEATURES

CROSS REFERENCE TO RELATED APPLICATIONS

This application claims priority under 35 U.S.C. 119(e) to U.S. provisional Patent Application 60/732,007 filed Nov. 1, 2005, which is hereby incorporated by reference in its entirety.

STATEMENT REGARDING FEDERALLY SPONSORED RESEARCH OR DEVELOPMENT

This invention was made, at least in part, with United States governmental support awarded by National Science Foundation Grants NSF CH 0076061, NSF DMR 0315428 and NSF DMR 0420768. The United States Government has certain rights in this invention.

BACKGROUND OF INVENTION

Substrate patterning techniques combining advanced lithographic processing and material deposition methods enable the fabrication of structures on substrate surfaces having well defined physical dimensions ranging from 10s of nanometers to 1000s of microns. These material processing methods are compatible with a wide range of substrate and deposition materials, including many dielectric, semiconducting and conducting materials. Given the high degree of precision and versatility provided by these methods, advanced substrate patterning techniques provide a robust fabrication platform for accessing a wide range of useful functional devices. These techniques currently play a central role in most semiconductor based technologies including, but not limited to, the manufacture of dense integrated circuits, memory devices and microelectronic devices. Furthermore, advanced substrate patterning techniques also provide a fabrication pathway for making nanometer and/or micron scale structures comprising elements in micro- and nano-electromechanical (MEMS & NEMS) and micro- and nanofluidic systems.

Recent developments in lithographic processing, including deep ultraviolet photolithography, electron beam writing and X-ray lithography methods, continue to extend the applicability of these techniques for generating patterns of smaller and smaller structures on substrate surfaces. Such advances in lithographic processing make it possible to generate very high aspect ratio recessed structures (>5:1 depth:width) having nanometer and micron sized dimensions. Such high aspect ratio structures have the potential to support densely packed device elements for (in) the next generation of microelectronic and nanoelectronic systems. Useful device elements fabricated using this method include electrical insulators (when the recessed structure is filled or coated with one or more insulators), or electrically conductive/semiconducting layers/superconducting (when the recessed structure is filled or coated with one or more conductors, semiconductors or super conductors). As device dimensions are reduced, however, significant challenges arise in filling or coating such high aspect ratio nanometer and micron size structures using conventional deposition methods. These challenges constitute a barrier to achieving the desired reduction of device dimensions (e.g. <65 nanometer) in ultra-large scale integrated circuit (ULSI) architecture and the multilevel metallization therein.

To fabricate the components of an electrical device, a selected material or combination of materials is often deposited into recessed features, such as trenches or vias, patterned into a substrate surface that spatially defines and organizes the various elements of the device. Deposition is commonly accomplished by exposure of the feature to a gas (or combination of gases) that condenses on or reacts on or with surfaces of the feature, thereby generating deposited layers that coat or fill the recessed feature with a material having selected properties. Important to providing device components exhibiting good electrical, mechanical optical and/or other properties, is the ability to fill or coat the recessed features in a continuous and conformal manner. For example, material deposition methods are preferred that form a conformal thin film layer in the recessed feature or that completely fill the feature without voids or gaps in the bulk of the deposited material or between the deposit and surfaces of the recessed features. Such voids and gaps are undesirable because they affect the electrical properties of the deposited layer, such as inductance, resistivity and/or capacitance, thereby, potentially degrading overall device performance and undermining device uniformity. Further, voids and gaps in the bulk of the deposit or between the deposit and surfaces of the recessed feature compromise the overall mechanical integrity of the processed structure.

A common problem encountered in coating or filling a recessed feature, such as a trench or via, using conventional deposition methods is that the deposition rate near the opening and the bottom of the feature is often significantly larger than the deposition rate onto the sides of the feature. This anisotropy arises from efficient supply of the deposition material to the surfaces near the opening and bottom surface in line-of-sight of the source of deposition gas. As a result of enhanced deposition to the regions of the feature near the opening, flux anisotropy of deposition gas can lead to formation of an overhang proximate to the opening that prematurely seals the opening of the feature. Sealing (or "pinching off") of the opening prevents further deposition, thereby leaving undesirable voids or gaps in the lower regions of the recessed feature.

For high aspect ratio features (e.g. aspect ratios >5:1), the flux anisotropy of deposition gas can be so severe that virtually no material is deposited on the side walls of the recessed feature, particularly in the region of the side walls near the bottom of the feature. This problem is further exacerbated when the high aspect ratio feature being processed has small physical dimensions, such as having a width less than abut 0.1 microns, and when the deposition material has a large sticking coefficient with respect to uptake by the surface of the recessed feature. The shape of the high aspect ratio features may also contribute to an increased likelihood of void or gap formation during filling or coating. Reentrant features, such as a narrowing at the opening of the feature or widening at bottom of a feature, often enhances pinch-off problems during the processing of high aspect ratio features.

To address these challenges a number of processes have been developed for coating or filling high aspect ratio recessed features. While at least in part addressing the some of the problems with processing high aspect ratio features, these techniques are not universally compatible with all types of deposition materials, substrates and recessed feature geometries. In addition, each technique presents its own set of drawbacks that limit adoption and implementation of this technology.

Physical vapor deposition (PVD) encompasses a gamut of techniques including evaporation, sputtering and variants thereof. Due to the near-unity sticking coefficient of the arriving flux in most PVD coating applications, the ability of PVD processes to coat high aspect ratio features uniformly is severely limited. Modified PVD processes, however, such as collimated sputtering and ionized PVD have been demonstrated to provide some limited success in coating and filling moderate aspect ratio ($\leqq 5:1$) features. (See, S. M. Rossnagel, J. Vac. Sci. Technol. B 16 (1998) 2585).

Conventional thermal and plasma based chemical vapor deposition (CVD) processes typically perform well for moderate to low aspect ratio ($\leqq 5:1$) structures. The success of these processes for coating higher aspect ratio feature is largely dependent on operating in a regime in which the reactive species has a relatively low sticking coefficient. (See, M. M. Islamraja, M. A. Cappelli, J. P. McVittie, K. C. Saraswat, J. Appl. Phys. 70 (1991) 7137; and H. C. Wulu, K. C. Saraswat, J. P. Mcvittie, J. Electrochem. Soc. 138 (1991) 1831.).

A modified approach, high density plasma (HDP) CVD and variants, employs physical erosion (sputtering) of the deposited material from high energy ions to remove material from the exposed surfaces, including the trench opening. (See, S. V. Nguyen, IBM J. Res. Dev. 43 (1999)109; and D. R. Cote, S. V. Nguyen, A. K. Stamper, D. S. Armbrust, D. Tobben, R. A. Conti, G. Y. Lee, IBM J. Res. Dev. 43 (1999) 5, K. Takenaka, M. Kita, T. Kinoshita, K. Koga, M. Shirantani, Y. Watanabe, J. Vac. Sci. Technol. A 22 (2004), 1903). The flux of high energy ions does not impinge on the lower side walls of the trench, hence the film grows at a greater net rate in lower regions of the trench. Film and substrate damage from high energy ions, however, can be a severe limitation in this process.

Another approach is selective deposition by CVD, which is based on the inability of the precursor to nucleate a film on one substrate material compared to another. This approach has been utilized to selectively grow film on recesses in a substrate. The CVD of tungsten (W) and of group III-V semiconductors from their halogen based precursors are examples in which films nucleate on a semiconductor substrate but not on a mask material such as $SiO_2$. (See, T. F. Kuech, M. S. Goorsky, M. A. Tischler, A. Palevski, P. Solomon, R. Potemski, C. S. Tsai, J. A. Lebens, K. J. Vahala, J. Cryst. Growth 107 (1991) 116; and K. C. Saraswat, S. Swirhun, J. P. McVittie, J. Electrochem. Soc. 131 (1984) C86). A nucleation layer at the bottom of a trench or via can afford a bottom-up fill as demonstrated for AL-CVD. (See, L. Y. Chen, T. Guo, R. C. Mosley, F. Chen, Fully planarized dual damascene metallization using copper line interconnect and selective CVD aluminum plug, U.S. Pat. No. 6,537,905, Applied Materials Inc., 2003). Disadvantages of these techniques include the need for intermediate photolithographic steps to define a mask layer, and the need for mechanical polishing to remove unwanted seed layer.

Atomic Layer Deposition (ALD) is a technique with proven capability to coat aspect ratios exceeding 100. (See, R. G. Gordon, Abstr. Pap. Am. Chem. Soc. 227 (2004) U553; J. E. Crowell, J. Vac. Sci. Technol. A 21 (2003) S88; H. Kim, J. Vac. Sci. Technol. B 21 (2003) 2231; B. S. Lim, A. Rahtu, R. G. Gordon, Nat. Mater. 2 (2003) 749). The ALD process works by sequential exposure of the substrate to two different reactant gases under the special condition that the surface reactions during each exposure are self-limiting. The film typically grows at a very slow rate (e.g. a fraction of a monolayer per cycle), and, therefore, the cycle time is limited by the rate at which each reactant can be filled into and emptied from the growth chamber (or the lower portion of the recessed structure, whichever is longer). The disadvantage of this technique is the slow growth rate of the deposited film.

Electrochemical Deposition (ECD) is a well established and popular technique for coating surfaces and for filling deep features. This technique is commonly used to produce bottom-up growth of copper in trenches on ULSI circuits: differential plating kinetics are used to obtain "superconformal" or "super-filled" features. (See, P. M. Vereecken, R. A. Binstead, H. Deligianni, P. C. Andricacos, IBM J. Res. Dev. 49 (2005) 3). The differential plating kinetics are generated by using specific additives that segregate to the trench top or bottom and serve as either leveler (for differential inhibition of growth) or catalyst (for differential acceleration of growth). The net effect of ECD methods is a higher growth rate at the trench bottom.

Bottom-up Copper CVD extends the idea in electrochemical deposition to CVD approaches. In copper CVD from hexafluoroacetylacetonate-copper-vinyltrimethylsilane, iodine is added as a catalytic-surfactant to enable a bottom-up fill. (See, K. C. Shim, H. B. Lee, O. K. Kwon, H. S. Park, W. Koh, S. W. Kang, J. Electrochem. Soc. 149 (2002) G109). In this method, iodine is provided as a growth promoter and has a concentration that rises inside the feature as the deposition proceeds.

Bottom-up growth was reported by Heitzinger et al. in the specific system of polysilicon deposition from silane (the CVD precursor) when arsine was added to the process gas. (See, C. Heitzinger, W. Pyka, N. Tamaoki, T. Takase, T. Ohmine, S. Selberherr, IEEE Tran. Comput. Aided. Design. 22 (2003) 285.). In this method, arsine acts as a growth suppressor and is also incorporated into the deposition layer. A high process temperature (700° C.) is required to ensure a high reaction rate for arsine. The authors modeled their trench coverage on the basis of depleting arsine concentration in the trench and conclude that the experimental conditions employed result in operation in the time limit domain. (See, page 291, paragraph 3). The time limit stems from the fact that the suppressor is re-emitted from the film surface at some rate and ultimately will diffuse to the bottom of the trench, despite that fact that it has a higher sticking coefficient and lower concentration with respect to the precursor. In time limit domain, the bottom-up growth only takes place before the suppressor arrives at the bottom of the via by diffusion. After that, the suppressor concentration saturates from top to bottom and yields equal growth rates at all locations inside the via. A significant disadvantage of the time domain techniques described in Heitzinger et al. is that coating/filling larger structures requires a longer time to build up the appropriate layer thickness; and, thus, the time-limit bottom-up growth will not work because the suppressor will reach the bottom of the via before the structure is filled. Moreover, the time delay in these systems is very short (e.g. 54.25 s in FIG. 8 and 23.92 s in FIG. 9 of Heitzinger et al.) and it is difficult to control such a short growth time during processing.

It will be appreciated from the foregoing that there is currently a need in the art for methods of conformally or superconformally coating and uniformly filling features on substrates. Specifically, processing methods are needed that are capable of filling and coating high aspect ratio recessed features having small dimensions (e.g. 10 nanometers to 1000 microns).

SUMMARY OF THE INVENTION

The present invention provides methods for conformally or superconformally coating and/or uniformly filling structures with a continuous, conformal layer or superconformal layer. Methods of the present invention improve conformal or superconformal coverage of surfaces and improve fill in recessed features compared to conventional physical deposition and chemical deposition methods, thereby minimizing formation of voids or gaps in a deposited conformal or superconformal layer. The present methods are capable of coating or filling features useful for the fabrication of many types of electrical and electromechanical devices, including trenches, vias and relief features having physical dimensions ranging from, but not limited to, a few nanometers to 1000s of microns, and are particularly well suited for depositing a conformal or superconformal layer on and/or in high aspect ratio recessed features (e.g. aspect ratio >5). Methods of the present invention are also particularly useful for conformally or superconformally coating and/or uniformly filling reentrant features, such as recessed features having a narrowing at their openings. The present methods are compatible with a wide range of existing materials processing techniques and processing conditions, and are useful for making a wide range of functional devices including, but not limited to, integrated electric circuits, macroelectronic device arrays, memory devices, sensors, MEMS & NEMS systems, photovoltaic devices, and micro- and nanofluidic systems.

In one aspect, the present invention provides a method for depositing a conformal or superconformal layer on a recessed feature of a substrate, wherein the deposited layer conformally or superconformally coats surfaces of the recessed feature and/or uniformly fills the recessed feature. In one embodiment of this aspect of the present invention, a substrate having a recessed feature is provided, wherein the recessed feature comprises an opening, a bottom surface and side surfaces extending from the opening to the bottom surface. The recessed feature is contacted with a flow of a suppressor gas capable of accommodation on the surfaces of the recessed feature in a manner establishing a substantially steady state, anisotropic spatial distribution of the flux suppressor gas to the recessed feature. The recessed surface is also contacted with a flow of a deposition gas capable of deposition onto surfaces of the recessed feature, and optionally this step is carried out concurrently with the step of contacting the recessed feature with the flow of suppressor gas. Accommodation of suppressor gas generates suppressor on surfaces of the recessed feature that decreases the rates of deposition from the deposition gas onto surfaces having suppressor present.

In this aspect of the present invention, the flux of suppressor gas to the recessed feature generates suppressor on selected, localized regions of the surfaces of the recessed feature where suppression of the rate of deposition from the deposition gas is desired. In an aspect of the present invention useful for providing superconformal or bottom-up filling of recessed features, for example, the composition and flow rate of suppressor gas is selected such that the rate of deposition onto regions of the recessed feature proximate to (e.g. within about the upper one-third of the feature undergoing processing) the opening and/or in line-of-sight of a source of deposition gas is reduced. In this embodiment, deposition preferentially occurs on the side surfaces of the recessed feature proximate to the bottom (e.g. below about the upper one-third of the feature undergoing processing), thereby providing preferential deposition and growth of a conformal or superconformal layer onto the lower regions of the recessed layer. Use of a suppressor gas in the present invention, therefore, provides a means of controlling local deposition as a function of position in the recessed feature. In an embodiment useful for conformally or superconformally coating and uniformly filling high aspect ratio recessed features, for example, an anisotropic spatial distribution of the suppressor gas is selected to provide superconformal or bottom-up filling or coating, preferentially a substantially steady state anisotropic spatial distribution for some processing applications. Methods of this aspect of the present invention provide an inverted differential growth rate of the conformal or superconformal layer as compared to conventional CVD techniques.

As result of the ability of the flux of suppressor gas to locally suppress the deposition rates of the deposition gas, the spatial distribution of deposition rates from the deposition gas onto the recessed feature in the present invention is anisotropic. In methods of the present invention wherein the suppressor gas has a significantly larger (e.g. more than about ten times greater) sticking coefficient with respect to accommodation on surfaces of a feature undergoing processing than the corresponding sticking coefficient of the deposition gas, the spatial distribution of the flux of suppressor gas is significantly more anisotropic in nature than the spatial distribution of the flux of deposition gas.

In some embodiments of this aspect of the present invention, the anisotropy of the suppressor flux generates a selected concentration gradient of suppressor along the side surfaces of the feature. In embodiments useful for providing superconformal or bottom-up filling, for example, the anisotropic spatial distribution of the flux suppressor gas to the recessed feature is selected such that suppressor concentrations on the side walls decrease from the opening toward the bottom surface of the recessed feature. As a result of this concentration gradient, suppressor is largely confined to regions of the side surfaces proximate to (e.g. within about the upper one-third of the feature undergoing processing) of the opening and/or confined to surfaces of the recessed feature in line-of-sight of a source of suppressor gas. In these embodiments, side surfaces deep within the recess, such as side walls near the bottom surface, interact with very little or no suppressor gas, and therefore have little suppressor present (e.g. the concentration is small enough that the deposition rate is near the value it would have at that deposition gas pressure in the absence of any suppressor) during processing.

As the flux of suppressor to surfaces of the recessed feature generates suppressor for reducing the rate of deposition from the deposition gas, it is the steady state, anisotropic spatial distribution of the flux of suppressor gas that controls local deposition rates from a deposition gas as a function of position in the recessed feature. In one embodiment, use of a suppressor gas having a relatively large sticking coefficient, such as a sticking coefficient greater than or equal to ten times the sticking coefficient of the deposition gas, is beneficial because it provides a highly anisotropic spatial distribution of the flux of suppressor gas wherein the flux of suppressor gas is localized near the opening of the recessed surface and decreases along the side surfaces from the opening toward the bottom surface. This anisotropic spatial distribution is particularly beneficial for suppressing deposition from the deposition gas onto surfaces proximate to the opening, thereby providing for preferential deposition from the deposition gas onto the lower regions (i.e. proximate to the bottom) of the recessed feature. Suppression of deposition onto surfaces proximate to the opening retards or eliminates premature sealing of the recessed feature during processing, thereby promoting formation of a continuously uniform conformal or superconformal deposition layer free of voids and gaps.

Methods of the present invention using a suppressor gas having a large sticking coefficient are also beneficial for suppressing deposition from the deposition gas onto surfaces of the recessed feature in line-of-sight of a source of deposition gas. In molecular flow conditions or near-molecular flow conditions (where the mean free path for gas-phase molecular collisions is comparable to or greater than the largest dimension of the recessed feature), for example, use of a suppressor gas having a high sticking coefficient results in an anisotropic spatial distribution of the flux of suppressor gas affording an enhanced suppressor gas flux to surfaces in line-of-sight of a source of suppressor gas relative to surfaces not in line-of-sight of the source of suppressor gas. Suppressor on line-of-sight surfaces results in preferential deposition from the deposition gas onto regions of the surfaces of the recessed feature that are not in line-of-sight of the source of deposition gas, such as lower regions of the side surfaces proximate to the bottom surface. This aspect of the present invention is advantageous for avoiding incomplete filling of lower regions of the recessed feature that can lead to voids and gaps in a deposited layer.

In addition to the suppressor sticking coefficient, the flow rate of the suppressor gas also affects the steady state, anisotropic spatial distribution of the flux of suppressor gas established during processing. In some embodiments, for example, use of a low flow rate of suppressor is desirable to establish a steady state, anisotropic spatial distribution of the flux of suppressor gas having enhanced flux to surfaces near the opening of the recessed feature relative to side surfaces proximate to the bottom surface. In some embodiments useful for providing superconformal or bottom-up filling of recessed features, the flow rate of suppressor is at least 10 times less than the flow rate of deposition gas. Use of low flow rates of suppressor in the present embodiment is beneficial for avoiding significant transport and accommodation of suppressor gas deep in a recessed feature (i.e. near the bottom surface) undergoing processing, which can impede effective superconformal or bottom-up filling of such features.

Means of establishing a steady state, anisotropic spatial distribution of the flux of suppressor gas during processing include control of the directional flux of suppressor gas. For example, the present invention includes methods wherein the position of a source of suppressor gas is selectively varied so as to change the anisotropic spatial distribution of the flux of suppressor gas during processing. Means of establishing a steady state, anisotropic spatial distribution of the flux of suppressor gas during processing also include selection of suppressor gas having a small or negligible re-emission rate to prevent re-emission and subsequent transport to recessed regions of the side surfaces proximate to the bottom surface. For some applications, it is desirable to use a suppressor capable of chemical transformation on the surface of the feature that converts it into a material (molecule) which eventually desorbs from the surface but does not subsequently react with the surfaces undergoing processing. Maintaining a substantially steady state concentration of suppressor on the surface can also be accomplished by pulsing the source of suppressor gas.

Selection of a deposition gas having appropriate chemical and physical properties is also important in the present invention. Deposition gases of the present invention interact with surfaces of a feature in a manner forming a deposited layer having a desired composition and phase. Useful deposition gases, for example, are CVD precursors that react on or with the surfaces of features to generate a deposited layer having desired composition via a chemical vapor deposition process. Alternatively, other useful deposition gases are PVD precursors that condense or react on a surface, are physi-adsorbed and/or are chemi-adsorbed on a surface of a feature undergoing processing via a physical vapor deposition process. Use of a deposition gas having a sticking coefficient with respect to deposition onto the surfaces of a feature undergoing processing that is lower than that of the suppressor gas is useful in methods of the present invention. In methods of the present invention providing superconformal or bottom-up filling, the sticking coefficient of the deposition gas with respect to feature surfaces (not having suppressor present) is at least 5 times smaller, and in some cases at least 10 times smaller, than the corresponding sticking coefficient of the suppressor gas. The present invention includes methods wherein additional deposition gases are exposed to the surfaces of a feature undergoing processing. These gases may be injected continuously or in a time varying or alternating manner. Additional deposition gases include gases that react with another deposition gas to generate a deposited conformal or superconformal layer having a desired composition and deposition gases providing to dopants (i.e. a controlled low concentration of additional specie(s)) in a deposited conformal or superconformal layer.

Useful anisotropic spatial distributions of the flux of suppressor in methods of the present invention are in substantially, steady state. In the context of this description substantially steady state refers to a spatial distribution of the flux of a material to surfaces that undergoes changes by less than about 20 percent over one minute, and for some processing applications by about less than 10 percent over one minute. A substantially steady state flux distribution arises from a combination of a flow rate that replenishes the gas phase with suppressor gas at substantially the same rate as the suppressor gas is lost to surfaces of the feature. In steady state, the suppressor flux anisotropy is also maintained by surface processes that consume/deactivate the suppressor. These processes include, but are not limited to, adsorption of the suppressor gas, reaction of the suppressor gas to form an inactive species, incorporation into the film, or a combination of these processes. In methods of the present invention providing superconformal or bottom-up filling, use of a substantially steady state anisotropic spatial distribution of the flux of suppressor avoids transport and accommodation of suppressor to lower, recessed regions of the side surfaces proximate to the bottom surface. In addition, use of a substantially steady state anisotropic spatial distribution of the flux of suppressor provides growth rate profile within the feature that makes the present methods highly versatile and, thus, capable of filling and/or conformally or superconformally coating recessed structures having a wide range of shapes, including reentrant recessed features, and a wide range of physical dimensions ranging from about 10 nanometers to about 1000 microns.

In some embodiments of this invention, it may prove advantageous to vary the flux of suppressor gas over time so as to move from one steady state distribution of suppressor to another. Such an embodiment would be advantageous for coating certain kinds of substrates, such as those that have a variety of recessed features with different aspect ratios or sizes, or substrates with unusually high aspect ratios (e.g., greater than 10). By using a large flux of suppressor gas at the beginning of a deposition process, the bottoms of features with large aspect ratios would be filled most quickly, while suppressing growth in the upper parts of the high-aspect ratio features and in all parts of features with smaller aspect ratios. If further filling of the recessed features was desirable, after filling of the bottoms of the features with large aspect ratios commenced, the flux of suppressor gas could be lowered to create a distribution of suppressors that extended a shorter distance away from the openings of the recessed features. In this way, unsuppressed deposition would occur farther and farther from the bottoms of the high aspect ratio features, and begin to accelerate in the bottoms of recessed features with smaller aspect ratios. Further reductions in the flux of suppressor gas would cause deposition to occur at non-suppressed rates higher and higher (farther and farther from the bottom) in the recessed features, leading eventually to complete filling of all features, even those with different aspect ratios. Although the flux of suppressor gas and the distribution of suppressors on the surface could change with time, at all times the distribution of suppressor on the surfaces of the substrate is in substantially steady state (e.g., <20% change over 1 minute).

Suppressor gases include atomic species, molecular species or combinations of these that interact with the surfaces of features undergoing processing in a manner generating suppressor capable of reducing the rate of deposition from a selected deposition gases. Suppressor gases may be neutrals or possess an electric charge (i.e. an ion). As the properties of deposition gases vary, selection of appropriate suppressor gas and deposition gas combinations is important in achieving optimal conformal or superconformal coating/filling conditions in the present invention. In some embodiments, the reduction in the rate of deposition from a deposition gas is proportional to the amount of suppressor present on the surfaces undergoing processing. Suppressor gases may react on or with feature surfaces or with other atoms or molecules to generate suppressor and/or may condense, undergo physiabsorption processes, and/or undergo chemi-adsorption processes on feature surfaces to generate suppressor. Suppressor gases of the present invention may undergo reactive loss on a feature surface, may be incorporated into a conformal or superconformal layer growing on a feature surface and/or may undergo desorption from the surface. In some embodiments of the present invention, the desorption rate of suppressor is preferably not too large with respect to the other surface processes or mechanisms causing loss of suppressor to avoid time-domain processing conditions. The present invention includes methods further comprising the step of contacting the surfaces of a feature undergoing processing with flows of additional suppressor gases.

Activated species, such as atomic hydrogen, atomic nitrogen, and atomic oxygen, provide particularly useful suppressor gases in the methods of the present invention, as the reactive nature of the atomic flux of these species ensures that the suppressor gas does not survive multiple collisions with the surface being processed. Sources of activated species providing suppressor gases in the present invention include any means known in the art, such as use of external plasma or hot filament sources. Activated species, such as atomic hydrogen, atomic nitrogen, and atomic oxygen, may undergo surface reactions which convert them to inactive molecular forms (e.g. $H_2$, $N_2$, and $O_2$), that subsequently are desorbed from the feature surface. Such desorption processes are useful when incorporation of suppressor into the growing conformal or superconformal layer is to be minimized or eliminated.

Methods of the present invention are compatible with a wide range of processing conditions and processing materials. In some embodiments, the pressure and temperature conditions are selected such that molecular flow conditions (or near molecular flow conditions) are maintained inside the recessed structures during processing, for example by keeping the total pressure less than or equal to about 10 Torr. Maintaining molecular flow conditions is beneficial because it allows the magnitudes and spatial distributions of the flux of suppressor gas and deposition rates deposition gas to be accurately calculated for a given set of processing parameters (e.g. exposure times, partial pressures of suppressor gas and deposition gas, substrate temperature), and thereby allows for determination of appropriate processing conditions necessary to conformally or superconformally coat and/or uniformly fill features having selected physical dimensions. The present methods, particularly those using activated suppressor gases such as atomic suppressor gases (e.g. H, N and O), are compatible with processing substrates held at relatively low temperatures (e.g. less than or equal to 300 degrees Celsius).

In other embodiments, however, higher pressures that are outside of molecular flow conditions are advantageous. Such advantages include but are not limited to growing films and filling features more quickly, or improving the morphology and smoothness of the deposit.

The methods of the present invention are capable of conformally or superconformally coating a wide range of features and structures. Methods of the present invention providing superconformal or bottom-up filling, for example, are capable of conformally or superconformally coating and/or uniformly filling recessed features having aspect ratios as large or larger than 100:1, and having physical dimensions selected over the range of about 10 nanometers to about 1000 microns. The present methods are well suited for depositing conformal or superconformal layers in recessed features having a range of shapes including, but not limited to, reentrant features, features having planar and/or curved surfaces, tapered features, cylindrical features, conical features, spherical features, tubular features, and rectangular features.

The present processing methods are also useful for conformally or superconformally coating relief features embossed or imprinted on a substrate surface. In this aspect of the present invention, the relief feature is contacted, concurrently or in a time varying sequence, with flows of suppressor gas and deposition gas. in the concurrent case, a substantially steady state anisotropic spatial distribution of the flux of suppressor is established, wherein surfaces of the relief feature in line-of-sight of a source of suppressor gas have a higher flux than surfaces not in line-of-sight of the source of suppressor gas. Optionally, the source of suppressor is moved during processing so as to change which surfaces of the relief feature undergo significant fluxes of suppressor gas. Methods of this aspect of the present invention are useful for conformally or superconformally coating relief features comprising complex three-dimensional structures, such as those comprising elements of MEMS and NEMS systems.

Substrates useful in the present methods include, but are not limited to semiconductor substrates, such silicon, silicon on insulator, germanium and gallium arsenide. Features may be generated on substrate surfaces by any means known in the art capable of defining the physical dimensions of features to be coated or filled, including but not limited to optical lithography, etching techniques, electron beam lithography, X-ray lithography, soft lithography, milling, and micromachining techniques.

In another aspect the present invention comprises a method for depositing a conformal or superconformal layer onto a recessed feature of a substrate comprising the steps of: (1) providing said substrate having said recessed feature, wherein said recessed feature comprises an opening, a bottom surface and side surfaces extending from said opening to said bottom surface; (2) contacting said recessed feature with a flow of a suppressor gas capable of accommodation on said surfaces of said recessed feature, thereby generating suppressor on surfaces of said recessed feature; (3) establishing a substantially steady state, anisotropic spatial distribution of the flux suppressor gas to said recessed feature, wherein the flux of suppressor gas decreases along said side surfaces from the opening to the bottom surface; and (4) contacting said recessed feature with a flow of a deposition gas capable of deposition onto said surfaces of said recessed feature; wherein suppressor on said surfaces decreases the deposition rate from said deposition gas onto said surfaces, and wherein deposition from said deposition gas results in deposition of said conformal or superconformal layer. Optionally, the step of contacting the recessed feature with the flow of deposition gas is carried out concurrently with the step of contacting the recessed feature with the flow of suppressor gas.

In another aspect the present invention comprises a method of superconformally or bottom-up filling a recessed feature of a substrate comprising the steps of: (1) providing said substrate having said recessed feature, wherein said recessed feature comprises an opening, a bottom surface and side surfaces extending from said opening to said bottom surface; (2) concurrently contacting said recessed feature with a flow of a suppressor gas and a flow of deposition gas, wherein said suppressor gas is capable of accommodation on said surfaces of said recessed feature and wherein said deposition gas is capable of deposition onto said surfaces of said recessed feature; (3) establishing a substantially steady state, anisotropic spatial distribution of the flux suppressor gas to said recessed feature, wherein the flux of suppressor gas generated suppressor on said surface and wherein the flux of suppressor decreases along said side surfaces from the opening to the bottom surface; and (4) establishing an anisotropic spatial distribution of the rate of deposition from deposition gas to said recessed feature, wherein the deposition rate of deposition gas increases along said side surfaces from the opening to the bottom surface, wherein suppressor on said surfaces decreases the rate of deposition from said deposition gas onto said surfaces, and wherein deposition from said deposition gas results in superconformally or bottom-up filling of said recessed feature.

In another embodiment, the present invention provides a method of depositing a conformal or superconformal layer onto a feature of a substrate, comprising the steps of: (i)providing said substrate having said feature, wherein said feature comprises surfaces in line-of-sight of a source of deposition gas and surfaces not in line-of-sight of said source of deposition gas; (ii) contacting said feature with a flow of a suppressor gas capable of accommodation on said surfaces of said recessed feature, thereby generating suppressor on said surfaces; (iii) establishing a substantially steady state, anisotropic spatial distribution of the flux suppressor gas to said feature, wherein the flux of suppressor gas to surfaces in line-of-sight of said source of deposition gas is larger than the flux of suppressor gas to said surfaces not in line-of-sight of said source of deposition gas; and (iv) contacting said feature with a flow of a deposition gas from said source of deposition gas, wherein said deposition gas is capable of deposition on said surfaces of said feature; wherein suppressor on said surfaces decreases the rate of deposition from said deposition gas onto said surfaces, and wherein deposition from said deposition gas results in deposition of said conformal or superconformal layer onto said feature of said substrate.

In another embodiment, the present invention provides a method for depositing one or more conformal or superconformal layers onto one or more features of a substrate, said method comprising the steps of: (i) providing said substrate having said feature, wherein said feature comprises an opening, a bottom surface and side surfaces extending from said opening to said bottom surface; (ii) contacting said feature with a flow of a suppressor gas having a first flow rate, wherein said suppressor gas is capable of accommodation on said surfaces of said feature, thereby generating suppressor on surfaces of said feature; (iii) establishing a first substantially steady state, anisotropic spatial distribution of the flux suppressor gas to said feature, wherein the flux of suppressor gas decreases along said side surfaces from the opening to the bottom surface; (iv) contacting said feature with a flow of a deposition gas capable of deposition onto said surfaces of said feature; wherein suppressor on said surfaces decreases the deposition rate from said deposition gas onto said surfaces, and wherein deposition from said deposition gas results in deposition of said conformal or superconformal layers; and (v) changing said flow of said suppressor gas to have a second flow rate that is different than said first flow rate, thereby establishing a second substantially steady state, anisotropic spatial distribution of the flux suppressor gas to said feature that is different that said first substantially steady state, anisotropic spatial distribution of the flux suppressor gas to said feature.

In another embodiment, the present invention provides a method for depositing one or more conformal or superconformal layers onto one or more features of a substrate, said method comprising the steps of: (i) providing said substrate having said feature, wherein said feature comprises an opening, a bottom surface and side surfaces extending from said opening to said bottom surface; (ii) contacting said feature with a flow of a suppressor gas having a first sticking coefficient, wherein said suppressor gas is capable of accommodation on said surfaces of said feature, thereby generating suppressor on surfaces of said feature; (iii) establishing a first substantially steady state, anisotropic spatial distribution of the flux suppressor gas to said feature, wherein the flux of suppressor gas decreases along said side surfaces from the opening to the bottom surface; (iv) contacting said feature with a flow of a deposition gas capable of deposition onto said surfaces of said feature; wherein suppressor on said surfaces decreases the deposition rate from said deposition gas onto said surfaces, and wherein deposition from said deposition gas results in deposition of said conformal or superconformal layers; and (v) replacing said flow of said suppressor gas with a flow of an additional suppressor gas having a second sticking coefficient that is different from said first sticking coefficient, thereby establishing a second substantially steady state, anisotropic spatial distribution of the flux of said additional suppressor gas to said feature that is different that said first substantially steady state, anisotropic spatial distribution of the flux said suppressor gas to said feature.

Methods of the present invention may include a large number of optional processing steps and processing conditions. In some methods of the present invention, the feature undergoing processing is a recessed feature or a relief feature. In some methods, the step of contacting the feature with a flow of a suppressor gas is carried out concurrently with the step of contacting the recessed feature with a flow of a deposition gas. In some methods, the suppressor gas has a sticking coefficient with respect to accommodation on the surfaces and the deposition gas has a sticking coefficient with respect to accommodation on the surfaces, wherein the sticking coefficient of the suppressor gas is at least 10 times larger than the sticking coefficient of the deposition gas.

BRIEF DESCRIPTION OF THE DRAWINGS

FIG. 1 provides a schematic diagram illustrating a deposition system useful in the present invention for conformally or superconformally coating and/or filling a recessed feature of a substrate. FIG. 1A provides schematic enlarged cross sectional views of exemplary recessed features useable in the present invention.

FIGS. 2A, 2B, and 2C provide thickness profiles, spatial distributions of the flux of deposition gas, spatial distributions of the flux of suppressor gas and growth rate profiles on the side surface of the trench for a sequence of processing times. In these figures, the y-axes correspond to depth in a recessed feature undergoing processing (normalized to a value of 1) and the x-axes correspond to flux of suppressor gas, flux of deposition gas and growth rate of a deposited film or layer on a sidewall of the feature (as indicated in FIGS. 2A, 2B, and 2C). FIG. 2A depicts a first time early in processing. FIG. 2B depicts a second time in processing later than the conditions corresponding to FIG. 2A. FIG. 2C depicts a third time in processing later than the conditions corresponding to FIG. 2B.

FIGS. 3A, 3B and 3C shows schematic diagrams depicting simulated deposition conditions in conventional CVD deposition methods not using a flow of suppressor gas. FIGS. 3A, 3B, and 3C provide calculated thickness profiles, spatial distributions of the flux of deposition gas, and growth rate profiles on the side surface of the trench for a sequence of processing times. FIG. 3A corresponds to a first processing time, FIG. 3B corresponds to a second processing time after the first processing time and FIG. 3C corresponds to a third processing time after the second processing time.

As shown in FIG. 6A, the coverage profile is typical of conventional CVD methods and shows that all the trench surfaces are partially coated but the opening is pinched-off. As shown in FIG. 6B, there is no pinch-off and the film is thickest on the sidewall near the bottom rather than the top of the trench—the inverse of the coverage obtained in the absence of the suppressor gas flux.

FIG. 10 provides an Auger profile of a multilayered $HfB_2$-$HfB_xN_y$ film showing that nitrogen was incorporated in the film only when the plasma was on.

In FIGS. 11A and 11B, the thickness of the sidewall of the trench is plotted as a function of the ratio of the position (x) to the width of the trench opening (d). FIG. 11A shows the thickness profile obtained with processing conditions including a concurrent flow of molecular $Pd(hfac)_2$ as the suppressor gas. $Pd(hfac)_2$ is bis(hexafluoroacetylacetonato)palladium. FIG. 11B shows the $HfB_2$ film thickness profile obtained using conventional CVD methods without a flow of suppressor gas.

DETAILED DESCRIPTION OF THE INVENTION

Figure 2A:
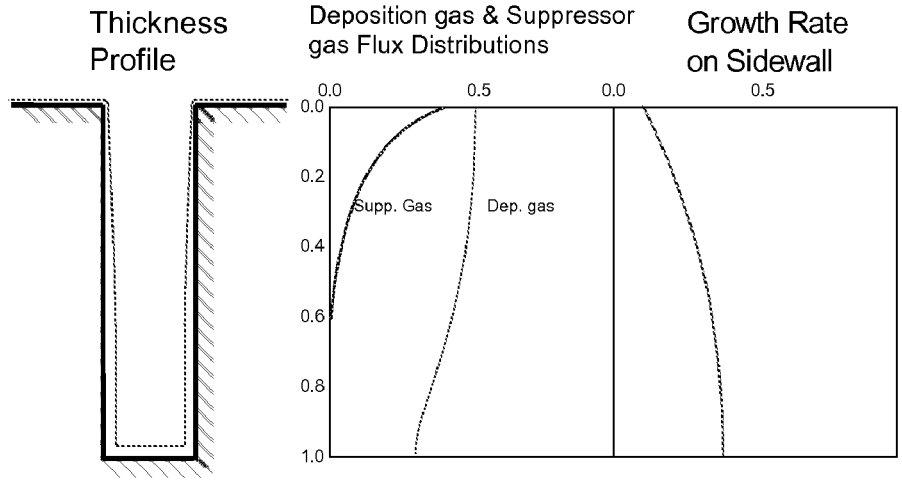
FIGS. 2A, 2B and 2C show schematic diagrams depicting simulated deposition conditions in methods of the present invention for superconformally or bottom-up filling a trench structure via deposition of a continuously conformal or superconformal layer.

Referring to the drawings, like numerals indicate like elements and the same number appearing in more than one drawing refers to the same element. In addition, hereinafter, the following definitions apply:

"Molecule" refers to a collection of chemically bound atoms with a characteristic composition. As used herein, a molecule can be neutral or can be electrically charged, such as singly charged and multiply charged ions.

"Conformal layer" refers to the physical characteristics of a layer of deposited material on a feature. Conformal layers preferably lack gaps or voids having a volume larger than about $10^{-6}$ µm$^3$ within the bulk phase of the conformal layer or positioned between the layer and the surfaces of a feature coated by the layer. Conformal layers have uniform thickness at any surface of the feature (with variation less than about 20%). Conformal layers in the present invention may have a uniform composition throughout the layer or may have a composition that varies through all or a portion of the layer. The term "superconformal" refers to the result in which the thickness of coating on the sidewall proximate to the bottom of the feature is larger than the thickness of coating on a surface immediately outside of the feature adjacent to its opening.

"Aspect ratio" is a physical characteristic of a recessed feature equal to the depth of the feature divided by the opening size of the feature (i.e. the cross sectional dimension (width or diameter) of the opening). Methods of the present invention are well suited for conformally or superconformally coating and/or uniformly filling high aspect ratio recessed features.

"Feature" refers to a three-dimensional structure or structural component of a substrate. Features may be recessed in which they extend into a substrate surface or may be relief features embossed on a substrate surface. Features include, but are not limited to, trenches, cavities, vias, channels, posts, slots, stands, columns, ribbons, pores, holes, apertures or any combination of these. Features include pores, channels, holes, cavities and apertures in porous and/or fibrous substrates.

Figure 7:
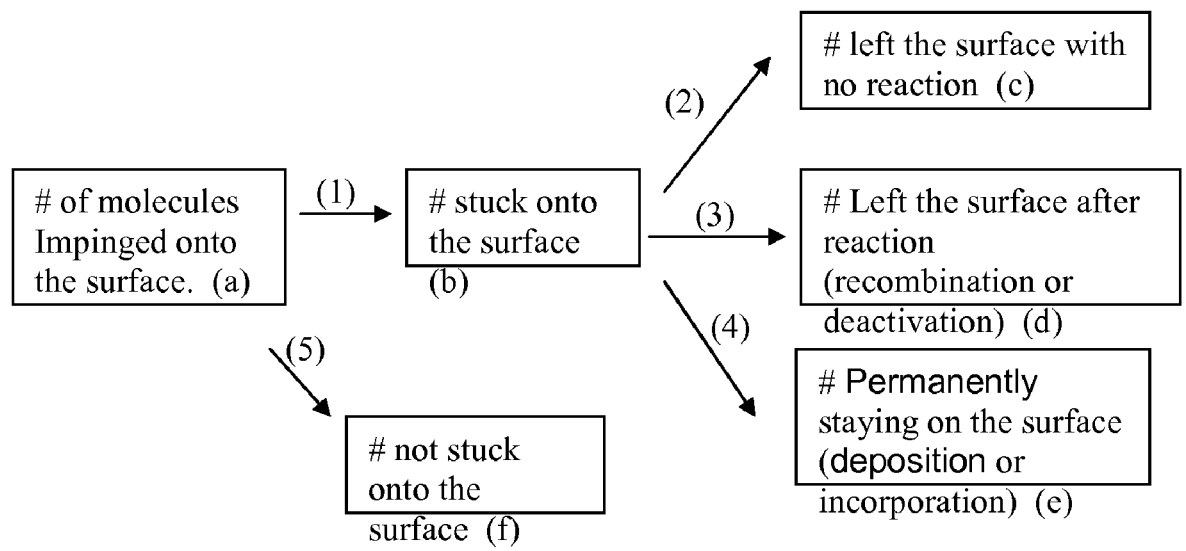
FIG. 7 provides a flow diagram illustrating a range of interrelated physical and chemical processes involved in uptake and reaction of gas phase materials (such as suppressor gas and/or deposition gases) with surfaces.

"Sticking coefficient" and "accommodation coefficient" are used synonymously in the present description, and refer to a characteristic of a material, such as a suppressor gas or deposition gas, that is the fraction of collisions of an atom or molecule with a surface that result in uptake (reactive or non-reactive uptake) by the surface. Thus, the "sticking coefficient" is the probability that a molecule or atom colliding with a surface will be lost from the gas phase to the surface. In this context, "lost to the surface" is intended to broadly encompass a wide range of chemical and physical processes including, reactive loss, condensation, physi-adsorption, chemi-adsorption and other forms of surface trapping. FIG. 7 provides a flow diagram illustrating a range of physical and chemical processes involved in uptake and reaction of gas phase materials with surfaces. Using fundamental principles (e.g. mass balance) coefficients, a and b can be related to coefficients c, d and e by the following expressions:

$$a=b+f;$$

and $$b=c+d+e.$$

Surface reaction probability or surface consumption rate is related to these parameters by the expression:

Surface Reaction Probability or Surface Consumption Rate=$(d+e)/a$.

In some embodiments, the anisotropic distribution of the deposition gas or suppressor gas is caused by a high value of surface reaction probability $(d+e)/a$, but not reemission rate $(c/b)$. Surface reaction probability is less than or equal to the sticking coefficient. However, a high sticking coefficient does not necessarily mean a high surface reaction probability. However, a high sticking coefficient and a low re-emission rate logically imply a high surface reaction probability.

"Flux" refers to the number of molecules or atoms that impinge (e.g. collide or otherwise interact with) on a surface or that pass through a given area of space per unit time per unit area. Flux may be expressed in units of (number $s^{-1}$ $cm^{-2}$), and is provided by the equation:

$$Flux = \frac{(\text{\# of molecules impinged on the surface})}{time \times area}$$

"Spatial distribution of a flux" refers to a one-, two- or three-dimensional representation of the fluxes of a material to one or more surfaces undergoing processing as a function of position on the surface(s). Accordingly, the spatial distribution of a flux is a function of position (e.g. x, y, z coordinates) on a feature. It is useful in some embodiments of the present invention to express the spatial distribution of a flux in terms of a depth profile, which characterizes the flux of a material to the surfaces of a recessed feature as a function of depth in the feature. An anisotropic spatial distribution of a flux refers to a distribution of the fluxes of a material to one or more surfaces that is not uniform with respect to position.

"Suppressor gases" include atomic species, molecular species or combinations of these that interact with the surfaces of features undergoing processing in a manner generating suppressor capable of reducing the rate of deposition of a film from a selected deposition gas or gases. Suppressor gases useful in the present invention may reduce the rate of deposition by reducing the sticking coefficient of a deposition gas on a feature surface, by reducing a surface reaction rate of a deposition gas or derivative thereof, and/or by reducing the nucleation and/or growth rates of a deposited layer. Suppressor gases may be neutrals or possess an electric charge (i.e. an ion). Suppressor gases may react on or with feature surfaces to generate suppressor and/or, may condense, react, undergo physi-adsorption processes, and/or undergo chemi-adsorption processes on feature surfaces to generate suppressor. Suppressor gases of the present invention may undergo reactive loss on a feature surface, may be incorporated into a conformal or superconformal layer growing on a feature surface and/or may undergo desorption from the surface. Suppressors useful in the present methods providing superconformal or bottom-up filling have small re-emission rates, or undergo surface reactions which convert suppressor to an inactive form (i.e. a form that does not affect the rate of deposition from a deposition gas) prior to re-emission or are incorporated into the growing film. Useful atomic suppressor gases include, but are not limited to, hydrogen, oxygen, nitrogen, chlorine and fluorine. Useful molecular suppressor gases include, but are not limited to, pure elements, and compounds that are combinations of elements (including hydrogen) with one or more of the following functional groups: hydrides, borohydrides, halides, oxides, chalcogenides, nitrides, pnictides, alkyls, aryls, allyls, cyclopentadienyls, alkenes, arenes, silyls, amides, amines, phosphides, phosphines, arsines, diazines, alkoxides, alcohols, ethers, siloxides, carboxylates, beta-diketonates, thiolates, selenolates, and tellurolates. The present invention includes methods simultaneously exposing a substrate to a plurality of suppressor gases, and methods wherein different suppressor gases are sequentially exposed to a substrate undergoing processing (i.e suppressor gas(es) are replaced with different suppressor gas(es) during processing).

The term "physical dimension" or "dimension" refers to a physical characteristic of a structure, feature of a structure or pattern of structures or features that characterizes how the structure, features or pattern of structures or features is oriented in two or three dimensions and/or occupies space. Physical dimensions of structures, features of structures or patterns of structures or features include, length, width, height, depth, radius, radius of curvature and periodicity.

"Deposition gas" refers to molecules or atoms that are capable of interacting with surfaces of a feature in a manner forming a deposited layer (i.e. undergo deposition), such as a conformal or superconformal layer. Useful deposition gases, for example, are CVD precursors that react with the surfaces of feature to generate a deposited layer having desired composition via a chemical vapor deposition process. Alternatively, other useful deposition gases are PVD precursors that condense on a surface, are physi-adsorbed and/or are chemi-adsorbed on a surface of a feature undergoing processing via a physical vapor deposition process. Useful deposition gases include, but are not limited to, pure elements, and compounds that are combinations of elements (including hydrogen) with one or more of the following functional groups: hydrides, borohydrides, halides, oxides, chalcogenides, nitrides, pnictides, alkyls, aryls, allyls, cyclopentadienyls, alkenes, arenes, silyls, amides, amines, phosphides, phosphines, arsines, diazines, alkoxides, alcohols, ethers, siloxides, carboxylates, beta-diketonates, thiolates, selenolates, and tellurolates. The present invention includes methods simultaneously exposing a substrate to a plurality of deposition gases, and methods wherein different deposition gases are sequentially exposed to a substrate undergoing processing (i.e deposition gas(es) are replaced with different deposition gas(es) during processing).

"Fluid communication" refers to the configuration of two or more elements such that a fluid, such as a gas, is capable of flowing from one element to another element. Elements may be in fluid communication via one or more additional elements such as openings, tubes, channels, valves, pumps or any combinations of these.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods for depositing a continuous conformal or superconformal layer on a feature of a substrate. The present invention provides methods of conformally or superconformally coating and/or uniformly filling recessed features, particularly recessed features having a large aspect ratio (e.g. greater than or equal to 5).

FIG. 1 provides a schematic diagram illustrating a top view of a deposition system useful in the present invention for conformally or superconformally coating and/or uniformly filling a recessed feature of a substrate. Deposition system 100 comprises a source of deposition gas 105, a source of suppressor gas 110, and a substrate 115 housed in high vacuum reactor 120. As shown in FIG. 1, source of deposition gas 105 and a source of suppressor gas 110 are in fluid communication with substrate 115 via inlets 125 and 126, respectively. Inlets 125 and 126 may be operationally coupled to metering valves (not shown in FIG. 1) capable of selectively adjusting the flow rate of deposition gas and/or suppressor gas provided to high vacuum reactor 120. Substrate 115 has at least one recessed feature 130 which is positioned on a surface of substrate 115 in fluid communication with source of deposition gas 105 and a source of suppressor gas 110. In a useful embodiment for providing superconformal or bottom-up filling, recessed feature 130 is positioned such that a portion of its surfaces (e.g. upper side surfaces and/or bottom surface) are in line-of-light with inlets 125 and 126. In some processing applications, the orientation of the substrate with respect to the sources of suppressor gas(es) and deposition gas(es) does not matter too significantly, as the distribution of gases is primarily decided by wall re-emission (or the lack of it). However, aiming the suppressor down the axis of the feature gives the best chance for distributing the suppressor to the desired depth in the feature, as needed depending on the aspect ratio and other conditions. Optionally, substrate 115 is provided with a means for changing its orientation during processing (not shown in FIG. 1), such as a means for rotating substrate 115 and recessed feature 130 during deposition of a conformal or superconformal thin film.

FIG. 1A provides schematic enlarged cross sectional views of exemplary recessed features useable in the present invention. As shown in the FIG. 1A, recessed feature 130 comprises an opening 135, side surfaces 140, top surfaces 147 (i.e. a surface outside of the feature) and a bottom surface 145. The top feature shown in FIG. 1A corresponds to a recessed feature having straight side surfaces 140 and the bottom feature shown in FIG. 1A corresponds to a reentrant recessed feature having side surfaces 140 that angle inward from bottom surface 145 to opening 135. As shown in the bottom feature in FIG. 1A, the side surface 140 configuration creates a narrowing at opening 135.

Source of deposition gas 105 depicted in FIG. 1 is a source of CVD precursor materials or reactants, such as $Cr[B_3H_8]_2$ or $Hf[BH_4]_4$. Source of suppressor gas 110 depicted in FIG. 1 is a source of an activated atomic suppressor, such as nitrogen or hydrogen atoms. Preferably, source of deposition gas 105 and source of suppressor gas 110 are each capable of providing a flow to substrate 115 having a selectively adjustable flow rate. In some embodiments, source of deposition gas 105 and source of suppressor gas 110 are positioned such that they are line-of-sight with substantially the same portions (e.g. similar to within 10 degrees in angle) of side surfaces 140 and/or a bottom surface 145 of recessed feature 130. Optionally, source of deposition gas 105 and source of suppressor gas 110 are movable, such that they a capable of selective adjustment of their positions during processing. This embodiment is useful for methods wherein the surfaces of recessed feature 130 in line-of-sight of source of deposition gas 105 and/or source of suppressor gas 110 are systematically changed during deposition of the conformal or superconformal layer. Optionally, deposition system 100 further comprises one or more additional sources of deposition gases (not shown in FIG. 1) and/or one or more additional sources of suppressor gases (not shown in FIG. 1).

According to the methods of the present invention, a flow of deposition gases (e.g. CVD precursors or CVD reactants) is generated by the source of deposition gas 105, and this flow is provided in contact with recessed feature 130. The deposition gas (or gases) is deposited on top surfaces 147, side surfaces 140 and a bottom surface 145, thereby generating and growing deposited conformal or superconformal layers on the recessed feature 130. A flow of suppressor gas (or gases) is directed onto recessed feature 130 either or not concurrently with the flow of deposition gas. The suppressor gas (or gases) is accommodated on top surfaces 147, side surfaces 140, and a bottom surface 145, thereby generating suppressor localized to selected regions of these surfaces that locally suppresses growth of the coating on regions of side surfaces having suppressor present. Deposition of a conformal or superconformal layer is provided by generation of a deposited layer on side surface(s) 140 proximate to bottom surface 145 having a thickness greater than the thickness of a deposited layer on top surfaces 147. in one embodiment, conformal coating is provided by exactly compensating for any nonuniformity in the growth rate due to the fact that the precursor flux is typically higher nearer to the opening of the feature.

In one embodiment, the suppressor gas (suppressor) has a higher sticking coefficient than the deposition gas. The suppressor gas is, hence, consumed at a faster rate relative to the deposition gas as it traverses the feature profile (i.e. transverse from opening 135 to bottom surface 145). Further, use of a suppressor gas having a large sticking coefficient establishes during the time the suppressor gas is being accommodated on the surface a substantially steady state anisotropic spatial distribution of the flux of suppressor gas to surfaces of the recessed feature, wherein the flux of suppressor gas to side surfaces 140 proximate to the opening 135 is larger than the flux of suppressor gas to side surfaces lower in the recessed feature. This anisotropy of the flux of suppressor gas results in a concentration gradient of suppressor along the profile of the feature, for example a concentration gradient wherein the concentration decreases along side surfaces 140 from opening 135 to bottom surface 145. Surfaces deep in the recess (for example, side surfaces 140 proximate to bottom surface 145), therefore, are exposed to a low suppressor/reactant ratio while side surfaces 140 proximate to opening 135 of recessed feature 130 are exposed to a high suppressor/reactant ratio. The growth rate gradient over the recessed feature is now opposite of what is typically observed in the absence of the suppressor, i.e. a higher growth rate deep inside the recess compared to the top surface. This prevents pinch-off of the opening and allows for a better coverage or a better fill.

When the fluxes of precursor gas and suppressor gas are injected into the vacuum system, a short time period (initial transient) is required for these gases to establish steady state pressure (flux) distributions within recessed features. "Short time period" means that during this initial transient, the thickness of film deposited is at most a few atomic layers. Because the eventual film thickness is equivalent to at least 10s, and typically 100s or 1000s, of atomic layers, the thickness profile of the film deposited during the initial transient makes a negligible contribution to the final thickness profile. After the initial transient, the pressure (flux) distributions do not change in time, except in a very slow fashion in the case where the aspect ratio of the feature changes due to the deposition of film on the walls. The aspect ratio influences the pressure distributions because the aspect ratio is directly related to the movement of gas into the feature via the appropriate gas transport equations.

Figure 2B:
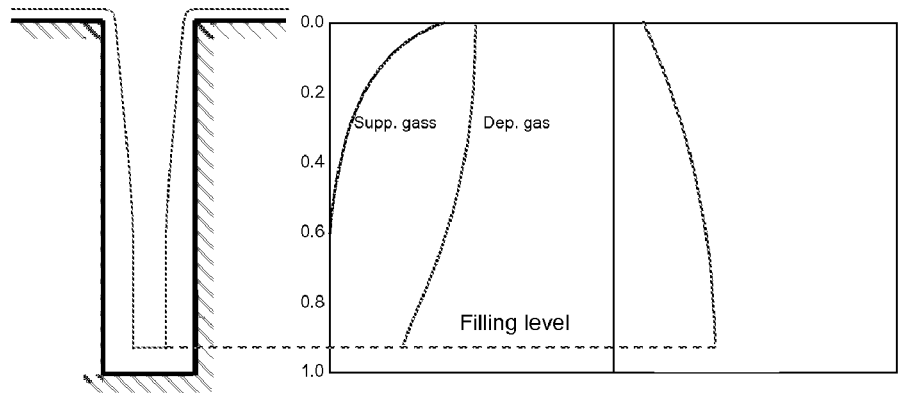
Figure 2C:
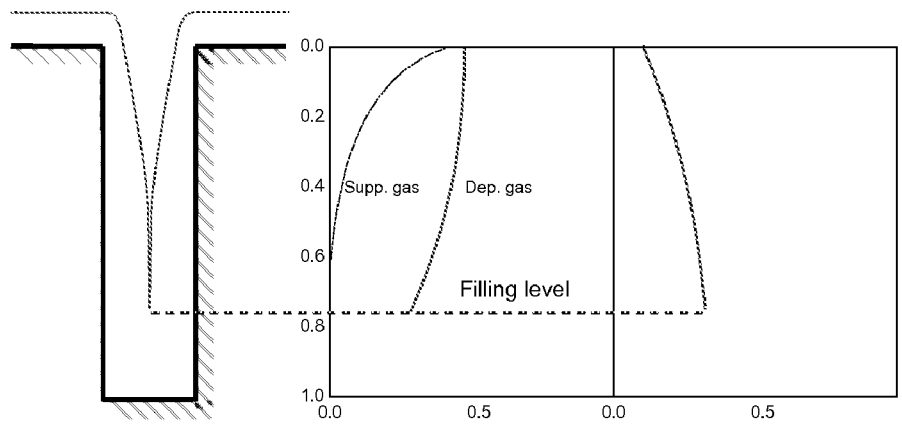

FIGS. 2A, 2B and 2C show schematic diagrams depicting simulated deposition conditions in methods of the present invention for superconformally or bottom-up filling a trench structure via deposition of a continuously conformal or superconformal layer. FIGS. 2A, 2B, and 2C provide thickness profiles, spatial distributions of the flux of deposition gas, spatial distributions of the flux of suppressor gas and growth rate profiles on side surface of the trench for a sequence of processing times. FIG. 2A depicts a first time early in processing. As shown in FIG. 2A, the spatial distribution of the flux of suppressor gas is significantly more anisotropic than the spatial distribution of the flux of deposition gas due to the large sticking coefficient of the suppressor gas, and the flux of suppressor gas is primarily localized to surfaces of the trench near the opening, thereby producing suppressor on the surfaces near to the opening of the trench. As a result of the presence of the suppressor, deposition of the deposition gas is suppressed on the upper surfaces of the trench and, thus, the deposition gas is able to be transported to lower regions of the trench. This allows deposition from the deposition gas to occur on the side surfaces and bottom surface having little suppressor present, thereby resulting in formation and growth of conformal or superconformal layers. As illustrated in FIG. 2A, the growth rate of the layers deposited on the side surfaces is significantly larger in the lower regions of the trench, which is characteristic of superconformal or bottom-up filling. As shown in FIG. 2A, the spatial distribution of the flux of deposition gas is also anisotropic and the deposition rate profile is inverted with respect to conventional CVD methods.

Because the growth rate near the opening of the trench is reduced by the presence of suppressor, the consumption of deposition gas is also reduced there. The bottom of the trench sees a higher amount of the deposition gas in comparison to conditions without a concurrent flow of suppressor gas. Moreover, the flux distribution is not influenced by the pinch-off effect because pinch-off is avoided. The growth is slower under a high flux of suppressor gas. So the growth rate at positions closer to the opening of the trench is smaller than deeper in the trench, which leads to the superconformal or bottom-up filling.

FIG. 2B depicts a second time in processing later than the conditions corresponding to FIG. 2A. As shown in FIG. 2A, the anisotropic spatial distribution of the flux of suppressor gas remains constant, provided that the flux distribution of suppressor gas is in steady state. This constraint is not necessary in the present invention (and under some circumstances it may be advantageous to change the flux of suppressor gas to go from one steady state condition to another), but constitutes one embodiment used here as an example. A minimum amount of deposited material is observed at the opening. FIG. 2B also shows the filling level indicating bottom-up filling conditions. FIG. 2C depicts a third time in processing later than the conditions corresponding to FIG. 2B. As shown in FIG. 2C, the anisotropic spatial distribution of the flux of suppressor gas remains unchanged providing further evidence of steady state conditions, and the conformal or superconformal layer continues to grow largely from the bottom surface toward the opening.

For the sake of comparison, FIGS. 3A, 3B and 3C shows schematic diagrams depicting simulated deposition conditions in conventional CVD deposition methods not using a flow of suppressor gas. FIGS. 3A, 3B, and 3C provide thickness profiles, spatial distributions of the flux of deposition gas, and growth rate profiles on the side surface of the trench for a sequence of processing times. FIG. 3A corresponds to a first processing time, FIG. 3B corresponds to a second processing time after the first processing time and FIG. 3C corresponds to a third processing time after the second processing time.

As shown in FIGS. 3A-3C, the growth rate of the deposited layers is to some extent proportional to the flux of deposition gas and, thus, it is higher at a position closer to the opening of the trench due to the observed flux anisotropy (e.g. the flux of deposition gas rapidly decreases along the trench depth). The decrease is a result of partial consumption of the flux on the portions of the trench wall near the opening during transportation. Meanwhile, the total amount of deposition gas flowing into the trench is limited by the finite conductance of the trench. As the film thickens, the pinch-off at the trench opening reduces the deposition flux that can transport into the trench, therefore the flux anisotropy of deposition gas as well as the growth rate anisotropy become more severe.

Figure 4A:
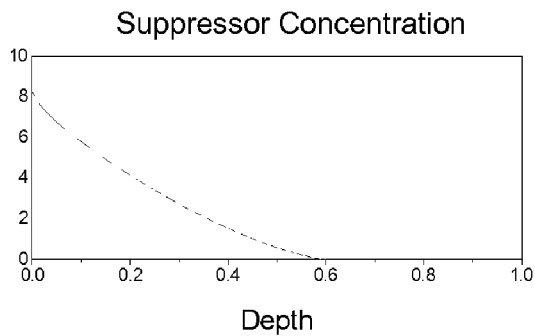
FIG. 4A provides a plot of the concentration of suppressor gas as a function of depth in a recessed feature calculated for a suppressor gas having a high sticking coefficient (e.g. equal to or larger than 0.1).
Figure 4B:
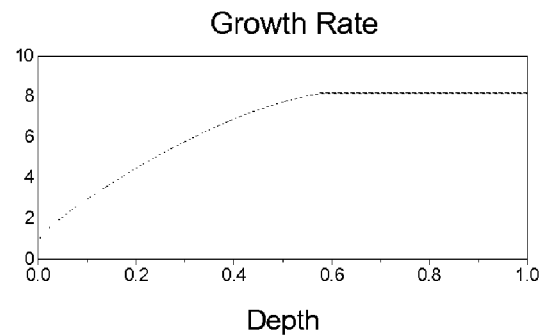
FIG. 4B provides a plot of the growth rate profile calculated for the suppressor gas concentrations shown in FIG. 4A.

FIG. 4A provides a plot of the concentration of suppressor gas as a function of depth in a recessed feature calculated for a suppressor gas having a high sticking coefficient. FIG. 4B provides a plot of the growth rate profile calculated for the suppressor gas concentrations shown in FIG. 4A. It is sometimes beneficial in methods of the present invention to maintain the spatial distribution of the flux of suppressor gas in substantially steady state, such that it undergoes less than 20% changes during processing. Maintaining steady state flux conditions provides methods of depositing conformal or superconformal layers applicable to recessed features having a wide range of physical dimensions. As shown in FIG. 4B, the growth rate of the deposited conformal or superconformal layer is lower at the opening of the trench with respect to the position deeper in the trench. Under steady state conditions the growth rate profile is also relatively invariant with time.

In the methods of the present invention, the pressure (flux) of the suppressor gas and/or the precursor gas and/or other process variables including, but not limited to, the substrate temperature, injection rate of suppressor gases and/or deposition gases, identity/composition of suppressor gas(es) and identity/composition of suppressor gas(es), may be changed in time during processing to achieve desired conformal or superconformal coating and/or uniform filling of features of a substrate. These changes may occur in discrete process steps or by continuous variation during processing. In any case, in our process the pressures (fluxes) of suppressor and precursor gases within the feature will rapidly evolve towards steady-state distributions. For the sake of illustrating an example of this feature of the methods of the present invention, consider a substrate having a surface containing a variety of recessed or relief features of varying aspect ratios and dimensions. It is desired to coat or fill all the features uniformly. In order to coat or fill those features with the highest aspect ratios, a relatively large pressure of suppressor gas (in combination with other process variables) must be used. However, such a large suppressor pressure will greatly diminish the growth rate of film on the features with lower aspect ratios (even possibly to essentially zero rate). The solution, therefore, is to begin growth with a high pressure of suppressor gas, and maintain that condition long enough for the highest aspect ratio features to be uniformly coated or filled. Then, either as a discrete or gradual change, the pressure of suppressor gas is reduced to a value appropriate for coating or filling the other features, which have lower aspect ratios. Alternatively, a similar processing condition may be achieved by initially using a first suppressor gas having a first (smaller) sticking coefficient to fill or coat the high aspect ratio features and, subsequently replacing the first suppressor with a suppressor having a second (larger) sticking coefficient that is larger than the first sticking coefficient of the first suppressor gas for subsequently filling and/or coating the smaller aspect ratio features. In this embodiment, use of a first suppressor having a smaller sticking coefficient allows it to penetrate more deeply into the via.

Any sequence of changes in the pressures (e.g. suppressor gas pressure, deposition gas pressure or total pressure) or other process variables may be used in order to accomplish the requirements of a particular substrate configuration. in addition the present invention includes processing methods wherein suppressor gas(es) are injected into the system in a series of very short pulses, such that it never reaches instantaneous steady-state but in a time-averaged sense gives the same result as injecting suppressor continuously.

Figure 5:
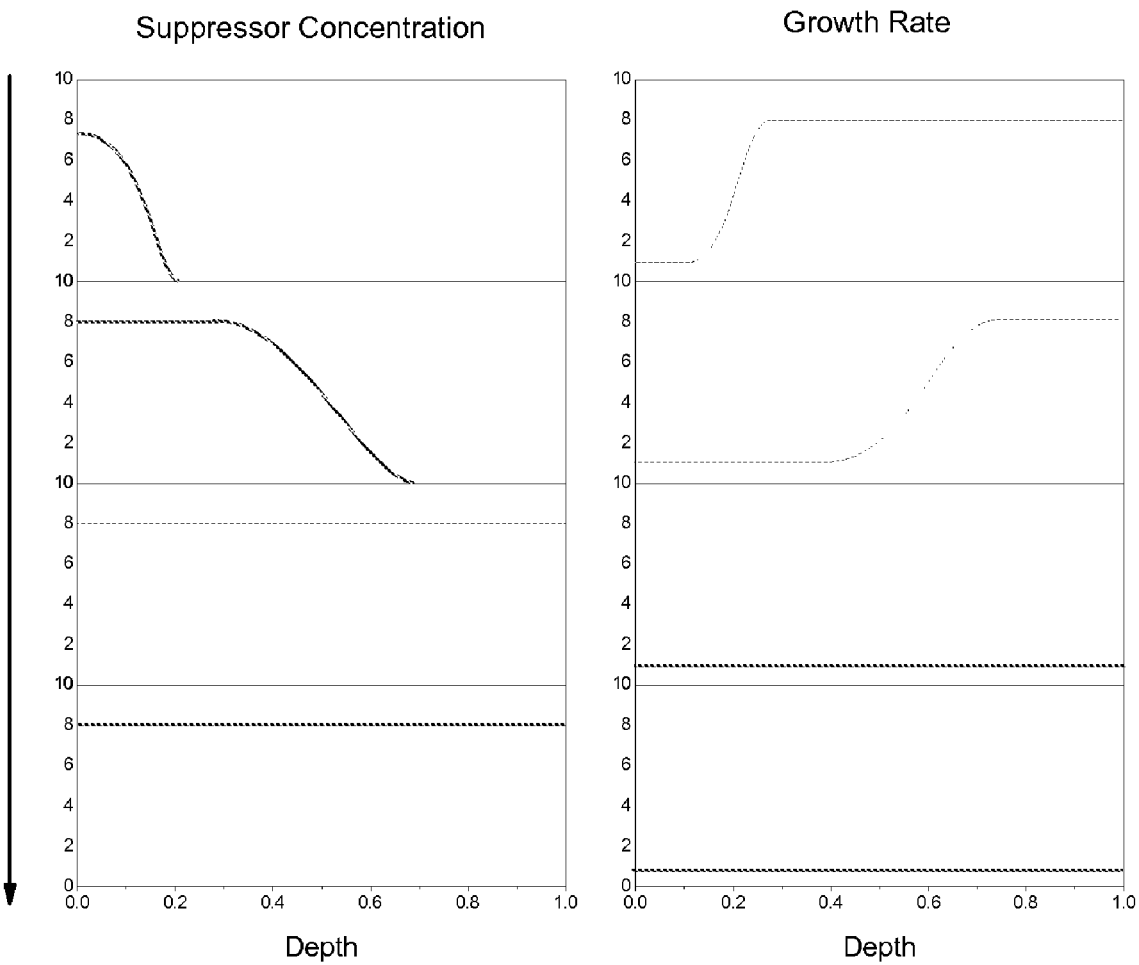
FIG. 5 provides suppressor gas concentrations and deposited film growth rates observed for processing conditions wherein the spatial distribution of the flux of suppressor gas is not provided in steady state.

For the sake of comparison, FIG. 5 provides suppressor gas concentrations and deposited film growth rates observed for processing conditions wherein the spatial distribution of the flux of suppressor gas is not provided in steady state. As shown in FIG. 5, under such a time domain limit, the suppressor gas will after a time delay diffuse to the bottom of the trench because the sticking coefficient of the suppressor is not sufficiently large with respect to the sticking coefficient of the deposition gas, and because the suppressor is not sufficiently deactivated upon interaction with the growth surface. During this time delay, as shown in 5(a) and 5(b), the bottom of the trench sees little to no suppressor gas and has a higher growth rate than the top surface. After this short time period, transport of the suppressor gas results in the suppressor gas concentration saturating from top to bottom and yields equal growth rates at all locations inside the trench. As shown in FIGS. 5(c) and 5(d), this results in an isotropic spatial distribution of the flux of suppressor gas to the surfaces of the feature. Although the growth rate of the precursor gas is reduced, it is reduced everywhere in the feature, which does not provide conformal coating or filling of the feature.

The present invention include methods wherein the sticking coefficient and/or surface reaction probability (or surface consumption rate) of the suppressor gas(es) is dependent on the composition of the surfaces of features undergoing processing. In one embodiment, for example, a substrate is provided with features having different surface compositions and different physical dimensions. Selection of the composition of the surfaces comprising each feature is used in these methods to provide different coating and/or filling conditions for different features subject to processing. Methods of this aspect of the invention may further comprise sequentially contacting the substrate with a plurality of different suppressor gases. This aspect of the present invention provides enhanced selectivity as selection of the composition of surfaces of the features and the identities of the suppressor gas are used in combination, at least in part, to control the spatial distributions of the fluxes of suppressor gases to features realized during processing.

The terms and expressions which have been employed herein are used as terms of description and not of limitation, and there is no intention in the use of such terms and expressions of excluding any equivalents of the features shown and described or portions thereof, and it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods and steps set forth in the present description. It will be understood by those skilled in the art that a wide range of suppressor gases, deposition gases and combinations thereof may be used in the present methods. Selection of the suppressor gas and deposition gas identities may be based on a number of variables including, but not limited to, the desired composition of the deposit, the physical dimensions of features to be coated or filled, the substrate composition, practical constraints on processing parameters such as temperature, pressure, kinetic considerations or any combination of these. Methods and devices useful for the present methods can include a large number of optional processing steps, including one or more of the following: (1) heating the substrate during processing to promote suppressor formation on the surfaces; (2) rotating the feature during processing to change which surfaces are exposed in line-of-sight to a source of suppressor gas and/or source of deposition gas; (3) contacting the feature undergoing processing with one or more additional deposition gases and/or one or more additional suppressor gases; (4) masking the substrate suppressor; (5) patterning the substrate with additional recessed and/or relief features; (6) selectively adjusting the position of a source of suppressor gas during processing, (7) electively adjusting the position of a source of deposition gas during processing, (8) exposing the substrate to electromagnetic radiation; (9) exposing the substrate to etchant during processing; (10) changing the suppressor gas composition or flow rate; (11) changing the deposition gas composition or flow rate; (12) changing the substrate temperature.

All references cited in this application are hereby incorporated in their entireties by reference herein to the extent that they are not inconsistent with the disclosure in this application. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques specifically described herein are intended to be encompassed by this invention.

When a group of materials, compositions, components or compounds is disclosed herein, it is understood that all individual members of those groups and all subgroups thereof are disclosed separately. When a Markush group or other grouping is used herein, all individual members of the group and all combinations and subcombinations possible of the group are intended to be individually included in the disclosure. Every formulation or combination of components described or exemplified herein can be used to practice the invention, unless otherwise stated. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms.

EXAMPLE 1

Improved Coverage and Bottom-Up Filling of Recessed Features by CVD 1.a Introduction A significant challenge associated with shrinking device dimensions in ULSI architecture ($\leqq$65 nm), and the multi-level copper metallization therein, is the need to conformally or superconformally coat or to fill high aspect ratio features. (In this example, the aspect ratio is defined as the depth of the feature divided by the width of its opening.) For example, typical metallization sequence includes a silicide of Ni or Co to form the first level of contact with the device. The silicide layer resides at the bottom of a via. This is followed by uniformly coating the via with adhesion (e.g. Ti) and diffusion barrier layers (e.g. TiN). Adhesion, diffusion barrier and seed layers (for Cu electroplating) are also needed on trenches that serve as interconnect lines after being filled with copper. The general problem is that the line-of-sight flux of growth species to the lower portions of the feature is usually much smaller than the flux near the opening. However, if the sticking probability of the growth species on surfaces is sufficiently smaller than unity, then the growth species can reach the lower portions of the feature after multiple wall collisions.

Physical vapor deposition (PVD) processes afford poor conformal coverage due to the high (near-unity) sticking coefficient of the arriving atoms. Magnetron sputtering, a well-established PVD method to deposit metallic films, has been improved by the use of collimators, or by ionizing and accelerating the sputtered atoms to obtain a forward-directed flux. The latter approach is useful for moderate aspect ratio features, up to about 5:1. Chemical vapor deposition (CVD) processes yield good conformal coverage on high aspect ratio features when the growth conditions create a low precursor sticking coefficient. However, for aspect ratios greater than 10:1, CVD coatings are conformal only when the sticking coefficient is extremely low (e.g., $<10^{-3}$). It is even more difficult to fill a feature because the growing film shrinks the width of the feature, which continuously increases the aspect ratio as growth proceeds. Growth rate differences result in film overhang near the opening, which ultimately blocks (pinches off) the opening leaving a void inside the feature. One way to compensate for this problem is to erode the film at the top by ion bombardment, but ion induced damage is a concern in such an approach. Atomic layer deposition (ALD), which is a stepwise form of CVD, can achieve excellent coverage on extremely high aspect ratio features and on features with complex shapes. This is due to the self-limiting nature of the surface reactions at each ALD step. The disadvantage is the low growth rate, typically $\leqq$0.2 nm/cycle, which makes ALD useful for depositing thin films but not for filling features.

In electroplating, a successful means to fill features is to use additives that suppress the reaction rate near the feature opening and/or increase it near the bottom. During copper electroplating, "levelers" segregate to the top of the feature, where they inhibit the growth; "accelerators" segregate to the bottom, where they catalyze the growth and afford bottom-up filling.

Two analogous processes have been reported for CVD growth. In the CVD of copper, bottom-up filling occurs when the surface of the feature is pre-treated with a catalyst (accelerator) such as iodine that remains segregated on the surface as growth proceeds. At the bottom of the feature, the surface area decreases as copper coats the nearby walls; this increases the concentration of the catalyst and in turn the deposition rate. In the growth of polycrystalline silicon from silane, an inhibitor such as arsine may be used to reduce the growth rate near the top of the feature, which can afford bottom-up filling. A high process temperature (700° C.) is required. Most importantly, the inhibitory effect operates in the time limit domain, and not at steady state. The time limit stems from the fact that the suppressor needs a longer time to diffuse to the bottom of the trench, due to its higher sticking coefficient and lower concentration, with respect to the precursor. In time limit domain, the bottom-up growth only takes place before the suppressor arrives at the bottom of the via by diffusion. After that, the suppressor concentration saturates from top to bottom and yields equal growth rates at all locations inside the via.

In this example, we describe a new approach using a suppressor gas flux of atomic hydrogen or atomic nitrogen during the CVD of transition metal diborides which provides excellent conformal or superconformal coverage or fill of high aspect ratio features.

1.b Experiment

We demonstrate improved coverage or bottom-up fill in two thin film systems, $CrB_2$ and $HfB_2$, using atomic H or N as the suppressor gas, respectively. $CrB_2$ is grown from the single source precursor $Cr[B_3H_8]_2$ while $HfB_2$ is deposited from the precursor $Hf[BH_4]_4$; both are solid sources with good volatility. The precursor pressures in the growth chamber are $9\times10^{-4}$ Torr for $Hf[BH_4]_4$ and $\sim4\times10^{-5}$ Torr for $Cr[B_3H_8]_2$, which is less volatile.

Trench substrates used in this example are formed by depositing $SiO_2$ (1.23 μm) on Si using PECVD, followed by lithography and RIE (reactive ion etching). The trench depth is 1.2 μm, while the trench widths range from 850-65 nm; the corresponding aspect ratios range from 1.4:1 to 19:1. For both precursors, a substrate temperature of 300° C. is used. A remote plasma source, consisting of a Pyrex® tube in a microwave cavity, is used as a source of atomic species. The tube extends beyond the discharge and into the growth chamber, ending ~13 cm from the substrate. Atomic hydrogen is generated from molecular hydrogen; atomic nitrogen is generated from a mixture of argon and molecular nitrogen. The atomic H flux is determined in a separate experiment in which the flux etches an amorphous carbon (a-C:H) substrate. The H flux can be varied between $10^{14}$-$10^{15}$ atoms/cm²-s by regulating the molecular hydrogen flow through the tube. For the nitrogen plasma, the Ar and $N_2$ flows are 10 sccm each and the total chamber pressure is 5.5 mTorr. The atomic nitrogen flux from the plasma is reproducible but not quantified. The effect of the suppressor gas flux on film stoichiometry is determined by SIMS (secondary ion mass spectrometry) for $CrB_2$ and by Auger spectroscopy for $HfB_2$.

1. c Results and Discussion

Figure 6A:
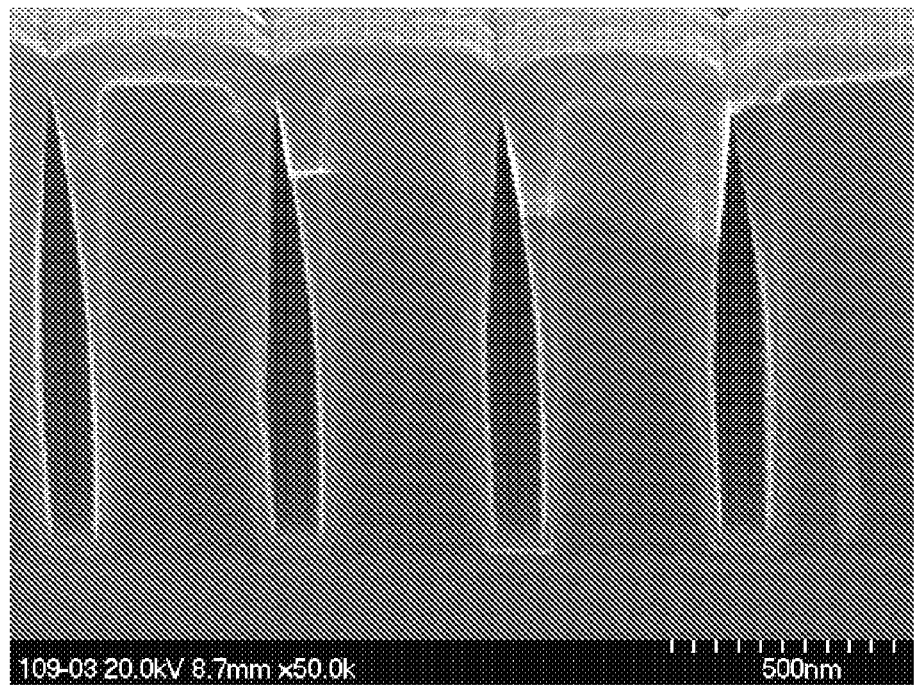
FIG. 6A provides a scanning electron micrograph of a fracture cross-section of a $CrB_2$ film deposited on the trench substrate by conventional CVD methods.
Figure 6B:
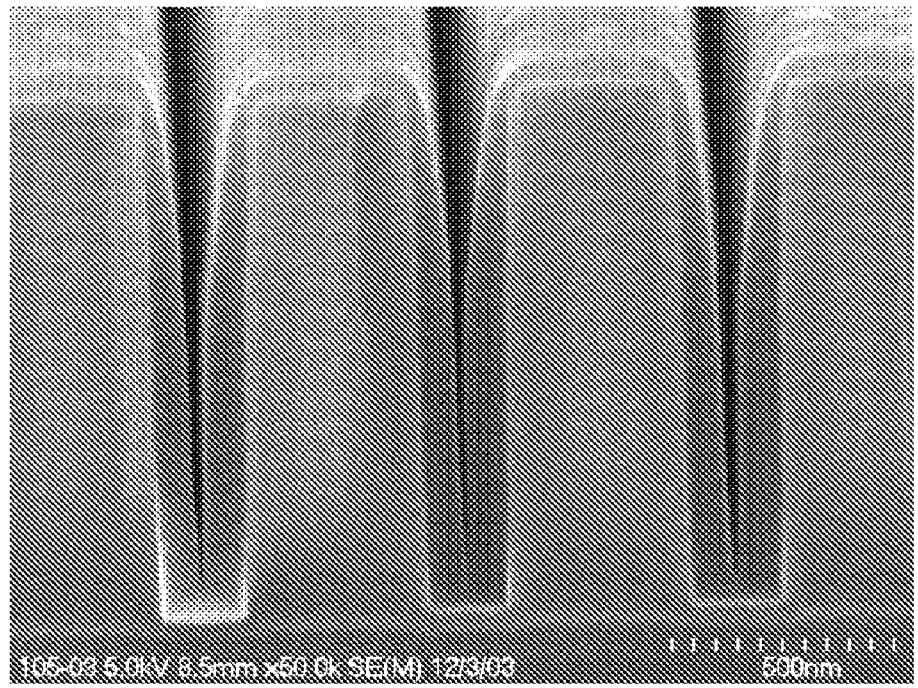
FIG. 6B provides a scanning electron micrograph of a $CrB_2$ film deposited on the trench substrate by CVD methods of the present invention having a flux of atomic hydrogen (H) provided during deposition.

FIG. 6A provides a scanning electron micrograph of a $CrB_2$ film deposited on the trench substrate by conventional CVD methods. As shown in FIG. 6A, the coverage profile is typical of conventional CVD methods and shows that all the trench surfaces are partially coated but the opening is pinched-off. When the deposition is repeated with the atomic H flux (~$3\times10^{14}$ cm$^{-2}\cdot$s$^{-1}$), the coverage improves remarkably. FIG. 6B provides a scanning electron micrograph of a $CrB_2$ film deposited on the trench substrate by CVD methods of the present invention having a flux of atomic hydrogen (H) provided during deposition. As shown in FIG. 6B, there is no pinch-off and the film is thickest on the sidewall near the bottom rather than the top of the trench—the inverse of the coverage obtained in the absence of the suppressor gas flux. The inverse coverage was not observed when the growth was repeated with molecular hydrogen (plasma off).

The growth rate on planar substrates shows that atomic hydrogen strongly suppresses the $CrB_2$ film deposition rate: with an atomic H flux of ~$3\times10^{14}$ cm$^{-2}\cdot$s$^{-1}$ the growth rate is reduced by 50%. Essentially no competitive etching of the deposited film occurs by the action of the atomic hydrogen. The hydrogen flux is anisotropic: it emerges from the tube in a very forward-directed manner. Surfaces deep within the trench have a very small line-of-sight (solid angle of exposure) to the suppressor gas flux. Hydrogen atoms can reach the lower portions of the trench only by making multiple wall collisions; however, atomic hydrogen recombines readily on surfaces to form molecular hydrogen, which is unreactive. This results in a H atom concentration gradient in the trench. As described above, the efficiency of the suppression is a function of the atomic hydrogen impingement rate. The growth rate is suppressed near the opening of the trench while the film grows faster deeper in the trench, preventing pinch-off.

Figure 8A:
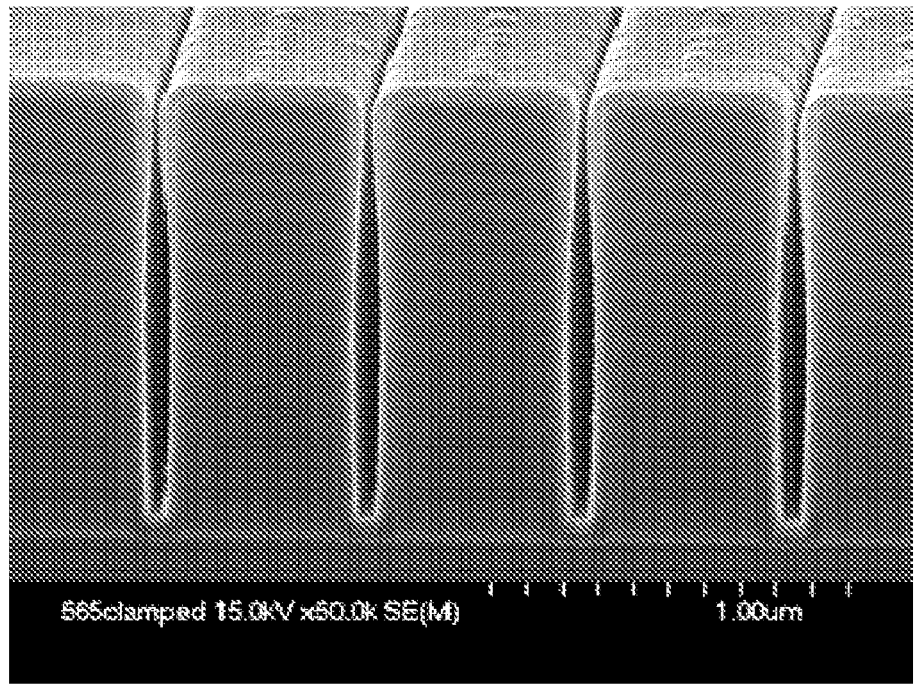
FIGS. 8A and 8B provide scanning electron micrographs illustrating trench coverage profiles observed in the deposition from $Hf(BH_4)_4$ at 300° C. by conventional thermal CVD (8A) and by the present CVD methods using atomic nitrogen from a remote plasma (8B).
Figure 8B:
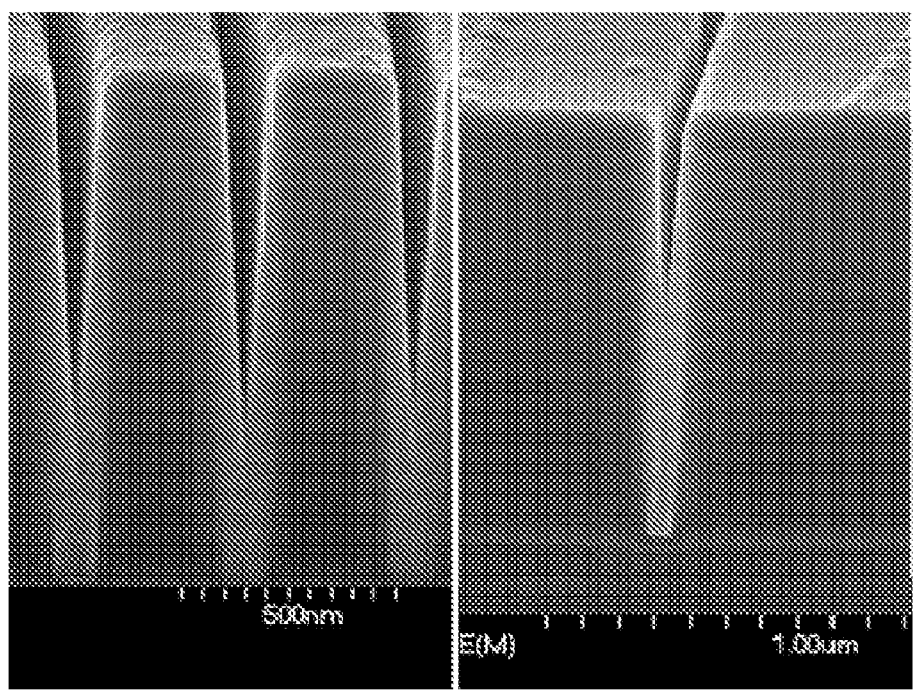

Atomic hydrogen has a similar, but less pronounced, effect on the growth of $HfB_2$. By contrast, atomic nitrogen is very efficient in suppressing the rate of $HfB_2$ growth. FIGS. 8A and 8B provide scanning electron micrographs illustrating trench coverage profiles observed in the deposition of $HfB_2$ at 300° C. by conventional thermal CVD (8A) and by the present CVD methods using atomic nitrogen from a remote plasma (8B). Thermal CVD of $HfB_2$ provides a good coverage of trench surfaces but the opening pinches off (See, FIG. 8A). With the addition of atomic nitrogen, a similar trench has a thicker coating at the bottom than the top (See, FIG. 8B). A 19:1 aspect ratio trench (FIG. 8B, right panel) shows no sign of pinch-off and would presumably have been filled completely from the bottom-up if the growth had continued. In the above example, the trenches are all from the same experimental run, during which atomic N was injected. The trench coated in the absence of atomic nitrogen (FIG. 8A) was shadowed by a clamp that blocked the atomic flux but allowed the precursor to arrive by diffusion. That atomic N did not diffuse around the clamp shows that it does not survive multiple collisions with surfaces.

Figure 9:
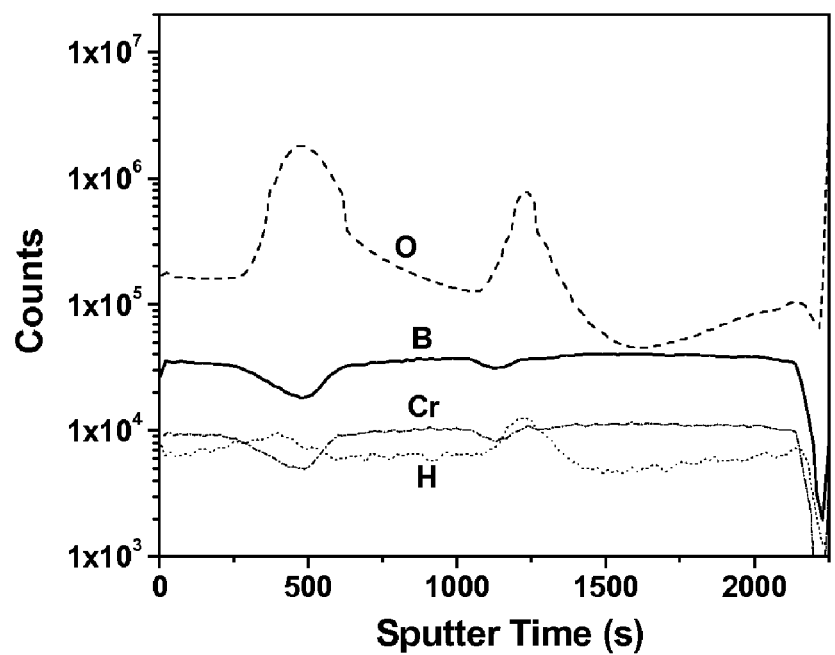
FIG. 9 provides a SIMS profile of a multilayered $CrB_2$ film; layers were deposited alternately with and without the H-flux. The film was exposed to an O-flux during growth to create a marker between the layers.
Figure 10:
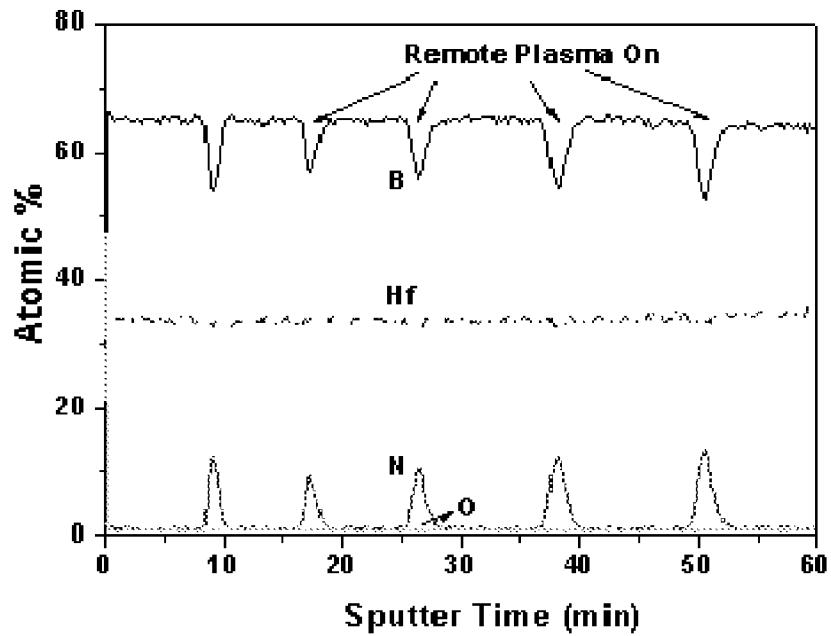

The addition of atomic hydrogen does not affect the stoichiometry of $CrB_2$ films. FIG. 9 provides a SIMS profile of a multilayered $CrB_2$ film; layers were deposited alternately with and without the H-flux. The film was exposed to an O-flux during growth to create a marker between the layers. The SIMS profile of a multilayer film, consisting of $CrB_2$ layers deposited with and without the H flux, shows no variation in the Cr, B and H contents of the layers (See, FIG. 9). To distinguish between the layers deposited with and without plasma, an intermediate layer was deposited in the presence of an Ar-$O_2$ plasma (1 at. % oxygen in argon). The addition of nitrogen does alter the stoichiometry of $HfB_2$ films. A multilayer film was deposited by turning the plasma off and on alternately (2 min each cycle) during the growth. FIG. 10 provides an Auger profile of the multilayered $HfB_2$-$HfB_xN_y$ film showing that nitrogen was incorporated in the film only when the plasma was on. Even though the times for the plasma on and off growth cycles were the same (2 min.), there is a large disparity in film thickness for the N-containing (Hf—B—N) and N-free ($HfB_2$) layers; this is because the film is deposited at a much lower rate with the plasma on. Growth rates measured separately on flat substrates indicate the atomic nitrogen flux suppressed the $HfB_2$ deposition rate by almost an order of magnitude.

In both systems (atomic H and N), a flux of suppressor gas atoms, generated by a remote plasma, is combined with the precursor flux. The rapid loss of the suppressant by recombination on, or incorporation with the growing film surface, results in growth rate suppression only at the top of the trench. The growth rate is therefore larger at the trench bottom. One criterion for choosing the suppressor gas may be to avoid changing the film stoichiometry. Hydrogen is a better choice in this regard. However, if stoichiometry is not very critical, then a remote nitrogen or other plasma may be used. Since the coating profile in the trench is determined by the impingement rate of the atomic flux (and of the precursor flux), the coating profile can be tuned by altering the flux and angular distribution of the suppressor gas. The concentration gradient of the suppressor gas arises due to the high sticking coefficient and, the limited molecular conductance.

EXAMPLE 2

Methods Using Molecular Suppressor Gases

Figure 12:
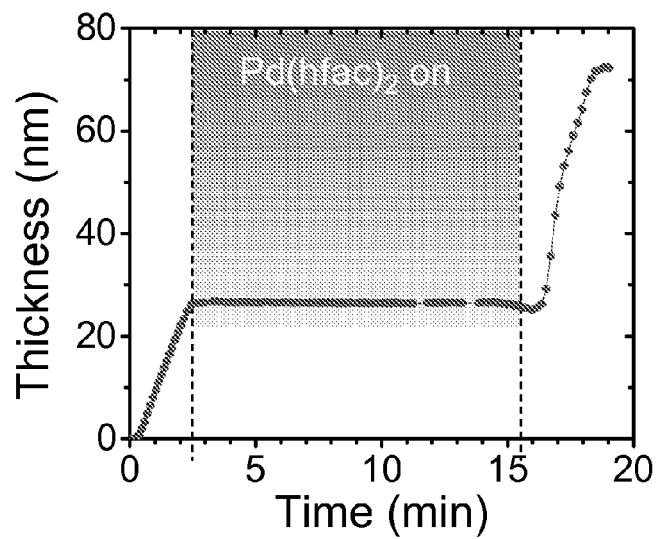
FIG. 12 shows the suppression of $HfB_2$ CVD growth by the suppressor $Pd(hfac)_2$. The $HfB_2$ film was grown on a silicon substrate and its thickness was measured by real-time spectroscopic ellipsometry. The precursor pressure was 0.2 mTorr throughout the process. In the first 2.5 minutes, when the $Pd(hfac)_2$ suppressor was not present, the film thickness increased linearly with time, indicating a steady state growth. The growth was suppressed immediately after the $Pd(hfac)_2$ flow ($P \leq 10^{-6}$ Torr) was turned on, and did not resume until a short time after the $Pd(hfac)_2$ flow was cut off.

The present invention includes processing methods using molecular suppressor gases. The example provided here is the CVD growth of $HfB_2$ films using $Hf(BH_4)_4$ as a deposition gas. The growth is strongly suppressed by bis(hexafluoroacetylacetonato)palladium, $Pd(hfac)_2$. On planar substrates, even a small flux of $Pd(hfac)_2$ can significantly suppress $HfB_2$ growth. In FIG. 12, the thickness of a $HfB_2$ film grown on a silicon substrate was measured in real-time by spectroscopic ellipsometry. The precursor pressure was kept at 0.2 mTorr throughout the process. In the first 2.5 minutes, when $Pd(hfac)_2$ was not present, the film thickness increased linearly with time, indicating a steady state growth. However, the growth stopped immediately after the $Pd(hfac)_2$ flow ($P \leq 10^{-6}$ Torr) was turned on, and did not resume until shortly after the $Pd(hfac)_2$ flow was cut off.

Figures 11A, 11B:
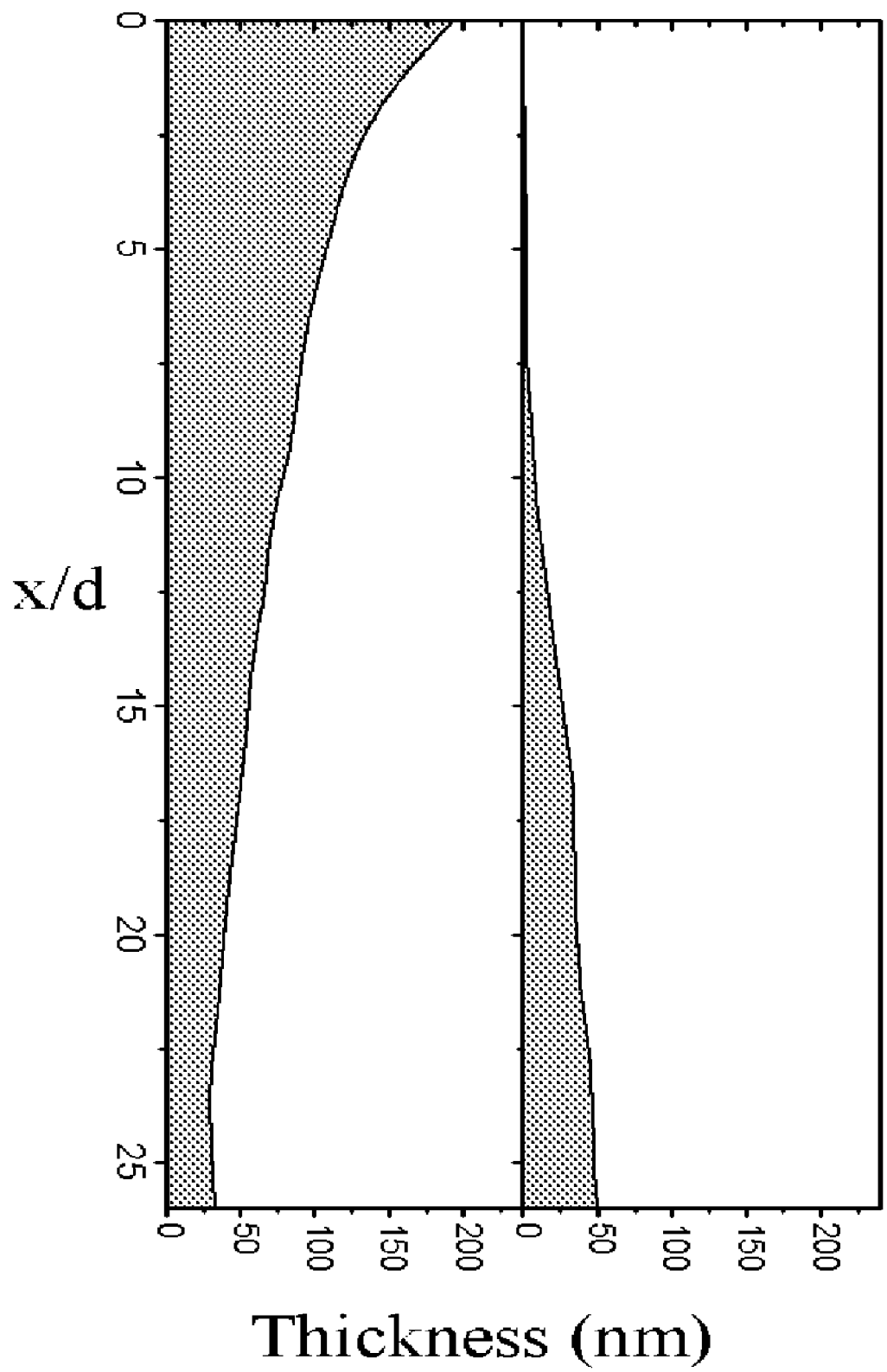
FIGS. 11A and 11B show thickness profiles of $HfB_2$ films deposited on the sidewall of a trench with aspect ratio of 27:1.

FIGS. 11A and 11B show thickness profiles of $HfB_2$ films on the sidewall of a trench with an aspect ratio of 27:1. In FIGS. 11A and 11B, the film thickness is plotted as a function of the ratio of the position inside the trench measured from the opening (x) divided by the width of the trench opening (d). The growth temperature in both cases was 240° C. and the deposition gas pressure was 0.2 mTorr.

FIG. 11A shows the thickness profile on the side wall of the trench obtained using conventional CVD methods without a flow of suppressor gas. The coating shows a typical profile that is thicker near the opening and thinner near the bottom. FIG. 11B shows the thickness profile obtained with identical processing conditions except that a concurrent flow of $Pd(hfac)_2$ was introduced as the suppressor gas ($P \leq 10^{-6}$ Torr). An inverted coating profile is observed, in which the film is thicker near the bottom.

An improved CVD method, which employs a growth suppressor gas, is used to coat or fill high aspect ratio features. A concentration gradient of the suppressor gas species in the trench results in an inverted differential growth rate compared to conventional CVD methods. Atomic hydrogen from a remote plasma was used as the suppressor gas to uniformly coat a 7:1 aspect ratio trench with $CrB_2$ with no pinch-off. Similarly, atomic nitrogen allowed for the filling of a 19:1 aspect ratio trench with an Hf—B—N film.

EXAMPLE 3

Application of the Present Methods for Infiltration Deposition

Figure 13:
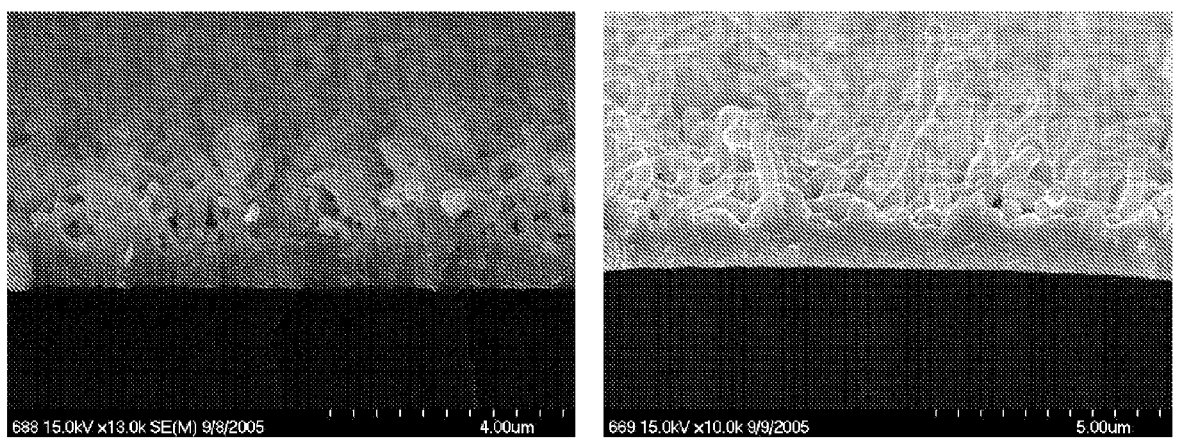
FIG. 13 provides images of a mass of carbon nanotubes infiltrated of with $HfB_2$.
Figure 14:
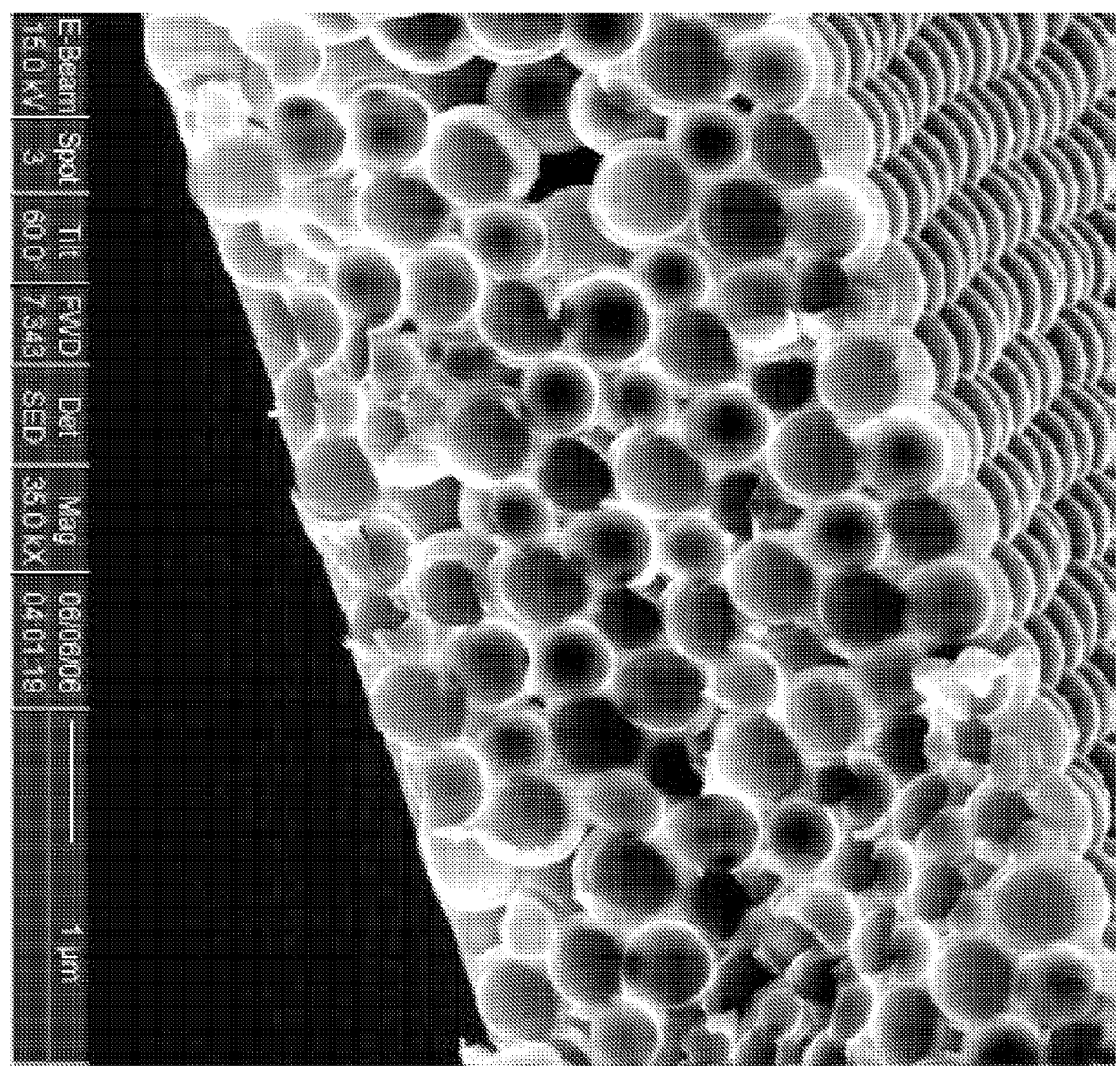
FIG. 14 provides a micrograph showing a coated array of packed silica spheres (colloidal crystal) generated by infiltration CVD without using a suppressor gas.

Another important application of the present methods is to fill in a porous or fibrous substrate, including the interconnected pores (interstities) in a geometrically defined object such as the packing of spheres or tubes, with the material(s) supplied by a precursor or a plurality of precursors, such as one or more deposition gases. This process is commonly referred to as infiltration deposition, chemical vapor infiltration, or similar. In these applications, the present methods are used to conformally or superconformally coat recessed features and or relief features in porous or fibrous substrates. FIG. 13 provides images of a mass of carbon nanotubes infiltrated with $HfB_2$. FIG. 14 provides a micrograph showing a coated array of packed silica spheres (colloidal crystal) generated by infiltration CVD without using a suppressor gas.

In conventional infiltration deposition techniques, a substantial challenge arises from processes that limit transport of deposition gases through narrow channels or features of a porous or fibrous substrate. For example, deposition of film on surfaces proximate to openings of pores or within pores in the substrate can constrict channels leading to the interior, thereby reducing the rate of transport or preventing entirely the transport of deposition gases to substantial internal regions of the substrate. Under some experimental conditions, deposition processes generate overhanging thin films proximate to the openings that actually seal off openings of pores, holes and channels of the substrate. Sealing or "pinching off" of these openings can limit further deposition, thereby preventing filling or conformal coating the interior regions of the porous or fibrous substrate. As the aggregate interior volumes of channels and/or pores can be quite significant, this limitation of conventional processing methods often results in very incomplete filling or coating of porous and/or fibrous substrates.

The present methods using a suppressor gas are well suited for infiltration deposition applications. In the methods, a flow of suppressor gas is provided during processing such that accommodation of suppressor gas on surfaces near the openings of features (e.g., pores, holes and channels) in the substrate locally reduces the deposition rate from deposition gases to these surfaces. The reduction in deposition rate reduces thin film growth at the openings of these features (e.g., pores, holes and channels), which minimizes constriction of pores and channels during processing, thereby allowing for transport of suppressor gas to the interior regions and surfaces of the substrate. In one embodiment the suppressor gas reduces the film growth rate to zero, thus eliminating the constriction problem near to the surface. Use of a flow of suppressor gas, therefore, allows deposition gases to penetrate into interior regions of a porous or fibrous substrate. This aspect of the methods of the present invention allows for conformal (or super conformal) coating and/or filling of features in porous and/or fibrous substrates including interior regions of pores and channels in the substrate.

In some aspects of the invention, a flow rate of suppressor is chosen so as to allow bottom filling of pores, holes and/or channels in a porous or fibrous substrate. In some embodiments, for example, a time varying flow rate of suppressor gas is employed so as to provide controlled filling and coating of interior regions of a porous or fibrous substrate. Initially, a large flow rate of suppressor is provided during exposure of a porous or fibrous substrate to one or more deposition gases. The large flow rate of suppressor gas substantially decreases deposition of film on surfaces proximate to the openings of pores, holes and channels of the substrate. These processing conditions allows deposition gas to be effectively transported to the interior regions enabling localized film growth on internal surfaces of the substrate, thereby achieving coating and filling of the internal regions. After substantially filling the interior regions of the porous or fibrous substrate, the flow of suppressor gas is decreased either continuously or stepwise as a function of time. The decrease in suppressor gas flow allows effective film deposition from the deposition gas to surfaces near the openings. These processing conditions result in localized film growth near the openings, thus enabling controlled conformal coating and/or filling of pores, holes or channels in the substrate without formation of voids or gaps.

In one embodiment of this aspect of the present invention, a method for conformally or superconformally coating features in a porous or fibrous substrate is provided comprising the steps of: (i) providing said porous or fibrous substrate having said features, wherein said features comprise surfaces in line-of-sight of a source of deposition gas and surfaces not in line-of-sight of said source of deposition gas; (ii) contacting said features with a flow of a suppressor gas capable of accommodation on said surfaces of said features, thereby generating suppressor on said surfaces of said features; (iii) establishing a substantially steady state, anisotropic spatial distribution of the flux suppressor gas to said surfaces of said features, wherein the flux of suppressor gas to surfaces of said features in line-of-sight of said source of deposition gas is larger than the flux of suppressor gas to said surfaces not in line-of-sight of said source of deposition gas; and (iv) contacting said features with a flow of a deposition gas from said source of deposition gas, wherein said deposition gas is capable of deposition on said surfaces of said features; wherein suppressor on said surfaces decreases the rate of deposition from said deposition gas onto said surfaces, and wherein deposition from said deposition gas results in deposition of said conformal or superconformal layers onto said features of said porous or fibrous substrate. The methods of this embodiment optionally comprise a method for infiltration deposition, chemical vapor infiltration, or similar. Methods of this embodiment are useful for coating or filling features of a porous or fibrous substrate having a range of shapes and physical dimensions including pores of the porous or fibrous substrate, recessed features, relief features or any combination of these.

We claim:

1. A method for depositing a conformal or superconformal layer onto a recessed feature of a substrate, said method comprising the steps of:

providing said substrate having said recessed feature, wherein said recessed feature comprises an opening, a bottom surface and side surfaces extending from said opening to said bottom surface;

contacting said recessed feature with a flow of a suppressor gas, thereby generating suppressor on surfaces of said recessed feature;

establishing a substantially steady state, anisotropic spatial distribution of the flux of the suppressor gas to said recessed feature, wherein the flux of the suppressor gas decreases along said side surfaces from the opening to the bottom surface; and contacting said recessed feature with a flow of a deposition gas; wherein suppressor on said surfaces decreases the deposition rate from said deposition gas onto said surfaces, and wherein deposition from said deposition gas results in deposition of said conformal or superconformal layer.

2. The method of claim 1 wherein said step of contacting said recessed feature with said flow of deposition gas is carried out concurrently with said step of contacting said recessed feature with said flow of suppressor gas.

3. The method of claim 1 wherein accommodation of said deposition gas to said side surfaces and bottom surface provides bottom-up filling of said recessed feature.

4. The method of claim 1 wherein said suppressor gas has a sticking coefficient with respect to accommodation on said surfaces and said deposition gas has a sticking coefficient with respect to accommodation on said surfaces, wherein said sticking coefficient of said suppressor gas is greater than said sticking coefficient of said deposition gas.

5. The method of claim 1 wherein said deposition gas has a sticking coefficient with respect to accommodation on said surfaces, and wherein accommodation of said suppressor gas by said surfaces results in a decrease of the deposition rate from said deposition gas by a factor greater than 1.

6. The method of claim 1 wherein said recessed feature comprises one or more surfaces in line-of-sight of a source of said flow of suppressor gas, wherein said substantially steady state, anisotropic spatial distribution of the flux of the suppressor gas to said recessed feature is characterized by a larger flux of the suppressor gas to said surfaces in line-of-sight of said source of said flow of suppressor gas than the flux of the suppressor gas to surfaces of said recessed feature that are not in line-of-sight of said source of said flow of suppressor gas.

7. The method of claim 1 wherein said substantially steady state, anisotropic spatial distribution of the flux of the suppressor gas to said recessed feature is characterized by a maximum flux to a region of said side surfaces that are proximate to said opening.

8. The method of claim 1 wherein said substantially steady state, anisotropic spatial distribution of the flux of the suppressor gas to said recessed feature is characterized by a maximum flux to regions of said recessed feature that are in line of sight of a source of suppressor gas.

9. The method of claim 1 wherein deposition of said deposition gas to said surfaces results in thin film growth on said surfaces, wherein the rate of thin film growth increases along said side surfaces from said opening to said bottom.

10. The method of claim 1 wherein said substantially steady state, anisotropic spatial distribution of the flux of the suppressor gas to said recessed feature is established by a method selected from the group consisting of:
controlling the direction of the flow of suppressor;
controlling the magnitude of the flow of suppressor;
selection of the sticking coefficient of the suppressor on said surfaces;
selection of the re-emission rate of suppressor on said surfaces;
selection of the deactivation rate of suppressor on said surfaces;
and any combination of these.

11. The method of claim 1 wherein said suppressor gas has a sticking coefficient selected over the range of about 1 to about $1.0\times10^{-3}$.

12. The method of claim 1 wherein said suppressor gas is an activated species.

13. The method of claim 1 wherein said suppressor gas is selected from the group consisting of atoms, radicals, ions and reactive species.

14. The method of claim 1 wherein accommodation of said suppressor gas by said surfaces generates suppressor on said surface, wherein said suppressor undergoes desorption from said surfaces or reactive loss from said surfaces.

15. The method of claim 1 wherein accommodation of said suppressor gas by said surfaces generates suppressor that is incorporated into said conformal or superconformal layer.

16. The method of claim 1 wherein said suppressor gas is an atomic species selected from the group consisting of: hydrogen (H); nitrogen (N); oxygen (O); fluorine (F), and chlorine (Cl).

17. The method of claim 1 wherein said suppressor is provided by a plasma source or heated filament.

18. The method of claim 1 wherein said suppressor is a molecular species comprising a compound that is combinations of elements with one or more of the following functional groups selected from the group consisting of hydrides, borohydrides, halides, oxides, chalcogenides, nitrides, pnictides, alkyls, aryls, allyls, cyclopentadienyls, alkenes, arenes, silyls, amides, amines, phosphides, phosphines, arsines, diazines, alkoxides, alcohols, ethers, siloxides, carboxylates, beta-diketonates, thiolates, selenolates, and tellurolates.

19. The method of claim 1 further comprising the step of contacting said recessed feature with at least one additional flow of at least one additional suppressor gas or replacing the flow of suppressor gas with one or more flows of one or more additional suppressor gases.

20. The method of claim 1 wherein said deposition gas has a sticking coefficient for accommodation on said surfaces selected from the range of about 0.1 to about $1\times^{-6}$.

21. The method of claim 1 wherein said deposition gas generates said conformal or superconformal layer by a process selected from the group consisting of:
chemical vapor deposition;
physical vapor deposition;
plasma chemical vapor deposition;
hot filament (surface) chemical vapor deposition; and
atomic layer deposition.

22. The method of claim 1 further comprising the step of contacting said recessed feature with at least one additional flow of at least one additional deposition gas or replacing the flow of deposition gas with one or more flows of one or more additional deposition gases.

23. The method of claim 1 wherein said recessed feature is selected from the group consisting of a trench, trough, slit, channel, via, hole, void and depression.

24. The method of claim 1 wherein said conformal or superconformal layer fills said recessed feature.

25. The method of claim 1 wherein said conformal or superconformal layer coats said recessed feature.

26. The method of claim 1 wherein said feature has an aspect ratio greater than 5.

27. The method of claim 1 wherein said conformal or superconformal layer comprises a material selected from the group consisting of an insulator, conductor, superconductor or a semiconductor.

28. The method of claim 1 wherein said steps of contacting said recessed feature with said flow of deposition gas and contacting said recessed feature with said flow of suppressor gas establishes an an isotropic spatial distribution of the deposition rate from said deposition gas to said recessed feature, wherein the deposition rate from said deposition gas increases along said side surfaces from the opening to the bottom of said recessed feature.

29. The method of claim 28 wherein said anisotropic spatial distribution of the deposition rate from said deposition gas to said recessed feature is spatially inverted with respect to said substantially steady state, an isotropic spatial distribution of the flux of the suppressor gas to said recessed feature.

30. The method of claim 1 wherein accommodation of said suppressor gas by said side surfaces generates suppressor on said surfaces, wherein said substantially steady state, anisotropic spatial distribution of the flux of the suppressor gas to said recessed feature generates a concentration gradient of a suppressor on said side surfaces wherein the concentration of said suppressor decreases along said side surfaces from said opening to said bottom surface.

31. The method of claim 30 wherein said suppressor is substantially confined to one or more regions proximal to said opening.

32. The method of claim 30 wherein said concentration gradient of suppressor is substantially constant with respect to time.

33. A method of bottom-up filling a recessed feature of a substrate, said method comprising the steps of:
providing said substrate having said recessed feature, wherein said recessed feature comprises an opening, a bottom surface and side surfaces extending from said opening to said bottom surface;
concurrently contacting said recessed feature with a flow of a suppressor gas and a flow of deposition gas;
establishing a substantially steady state, anisotropic spatial distribution of the flux of the suppressor gas to said recessed feature, wherein the flux of the suppressor gas generates suppressor on said surface and wherein the flux of the suppressor decreases along said side surfaces from the opening to the bottom surface; and
establishing an anisotropic spatial distribution of the rate of deposition from deposition gas to said recessed feature, wherein the deposition rate of deposition gas increases along said side surfaces from the opening to the bottom surface, wherein suppressor on said surfaces decreases the rate of deposition from said deposition gas onto said surfaces, and wherein deposition from said deposition gas results in bottom-up filling of said recessed feature.

34. The method of claim 33 wherein said suppressor gas has a sticking coefficient with respect to accommodation on said surfaces and said deposition gas has a sticking coefficient with respect to accommodation on said surfaces, wherein said sticking coefficient of said suppressor gas is at least 10 times larger than said sticking coefficient of said deposition gas.

35. A method of depositing a conformal or superconformal layer onto a feature of a substrate, comprising the steps of:
providing said substrate having said feature, wherein said feature comprises surfaces in line-of-sight of a source of deposition gas and surfaces not in line-of-sight of said source of deposition gas; contacting said feature with a flow of a suppressor gas, thereby generating suppressor on said surfaces;
establishing a substantially steady state, anisotropic spatial distribution of the flux of the suppressor gas to said feature, wherein the flux of the suppressor gas to surfaces in line-of-sight of said source of deposition gas is larger than the flux of the suppressor gas to said surfaces not in line-of-sight of said source of deposition gas; and
contacting said feature with a flow of a deposition gas from said source of deposition gas; wherein suppressor on said surfaces decreases the rate of deposition from said deposition gas onto said surfaces, and wherein deposition from said deposition gas results in deposition of said conformal or superconformal layer onto said feature of said substrate.

36. A method for depositing one or more conformal or superconformal layers onto one or more features of a substrate, said method comprising the steps of:
providing said substrate having said feature, wherein said feature comprises an opening, a bottom surface and side surfaces extending from said opening to said bottom surface; contacting said feature with a flow of a suppressor gas having a first flow rate, thereby generating suppressor on surfaces of said feature;
establishing a first substantially steady state, anisotropic spatial distribution of the flux of the suppressor gas to said feature, wherein the flux of the suppressor gas decreases along said side surfaces from the opening to the bottom surface;
contacting said feature with a flow of a deposition gas; wherein suppressor on said surfaces decreases the deposition rate from said deposition gas onto said surfaces, and wherein deposition from said deposition gas results in deposition of said conformal or superconformal layers; and
changing said flow of said suppressor gas to have a second flow rate that is different than said first flow rate, thereby establishing a second substantially steady state, an isotropic spatial distribution of the flux of the suppressor gas to said feature that is different that said first substantially steady state, anisotropic spatial distribution of the flux of the suppressor gas to said feature.

37. A method for depositing one or more conformal or superconformal layers onto one or more features of a substrate, said method comprising the steps of:
providing said substrate having said feature, wherein said feature comprises an opening, a bottom surface and side surfaces extending from said opening to said bottom surface; contacting said feature with a flow of a suppressor gas having a first sticking coefficient, thereby generating suppressor on surfaces of said feature;
establishing a first substantially steady state, an isotropic spatial distribution of the flux of the suppressor gas to said feature, wherein the flux of the suppressor gas decreases along said side surfaces from the opening to the bottom surface;
contacting said feature with a flow of a deposition gas; wherein suppressor on said surfaces decreases the deposition rate from said deposition gas onto said surfaces, and wherein deposition from said deposition gas results in deposition of said conformal or superconformal layers; and
replacing said flow of said suppressor gas with a flow of an additional suppressor gas having a second sticking coefficient that is different from said first sticking coefficient, thereby establishing a second substantially steady state, an isotropic spatial distribution of the flux of said additional suppressor gas to said feature that is different than said first substantially steady state, anisotropic spatial distribution of the flux of said suppressor gas to said feature.

38. A method for conformally or superconformally coating features in a porous or fibrous substrate, said method comprising the steps of: providing said porous or fibrous substrate having said features, wherein said features comprise surfaces in line-of-sight of a source of deposition gas and surfaces not in line-of-sight of said source of deposition gas;

contacting said features with a flow of a suppressor gas thereby generating suppressor on said surfaces of said features;

establishing a substantially steady state, anisotropic spatial distribution of the flux of the suppressor gas to said surfaces of said features, wherein the flux of the suppressor gas to surfaces of said features in line-of-sight of said source of deposition gas is larger than the flux of the suppressor gas to said surfaces not in line-of-sight of said source of deposition gas; and contacting said features with a flow of a deposition gas from said source of deposition gas; wherein suppressor on said surfaces decreases the rate of deposition from said deposition gas onto said surfaces, and wherein deposition from said deposition gas results in deposition of said conformal or superconformal layers onto said features of said porous or fibrous substrate.

39. The method of claim 38 comprising a method for infiltration chemical vapor deposition.

40. The method of claim 38 wherein said features are pores in said porous or fibrous substrate.

41. The method of claim 38 comprising a method of filling said features of said porous or fibrous substrate.

42. The method of claim 38 comprising a method of coating said features of said porous of fibrous substrate.

* * * * *

UNITED STATES PATENT AND TRADEMARK OFFICE
CERTIFICATE OF CORRECTION

| | | |
|---|---|---|
| PATENT NO. | : 7,592,254 B2 | Page 1 of 1 |
| APPLICATION NO. | : 11/554748 | |
| DATED | : September 22, 2009 | |
| INVENTOR(S) | : Abelson et al. | |

It is certified that error appears in the above-identified patent and that said Letters Patent is hereby corrected as shown below:

In claim 20, column 30, line 35, please replace "$1 \times^{-6}$" with --$1 \times 10^{-6}$--.

In claim 28, column 30, line 65, please replace "establishes an an isotropic" with --establishes an anisotropic--.

In claim 36, column 32, lines 27-28, please replace "an isotropic spatial distribution" with --anisotropic spatial distribution--.

In claim 37, column 32, lines 41-42, please replace "an isotropic spatial distribution" with --anisotropic spatial distribution--.

In claim 37, column 32, line 57, please replace "an isotropic spatial distribution" with --anisotropic spatial distribution--.

Signed and Sealed this
Third Day of May, 2011

David J. Kappos
*Director of the United States Patent and Trademark Office*